United States Patent
Gajiwala et al.

(10) Patent No.: US 11,301,053 B2
(45) Date of Patent: Apr. 12, 2022

(54) SYSTEM FOR PROVIDING HAPTIC FEEDBACK ACROSS FULL PALM REST IN FIXED POSITION OF INFORMATION HANDLING SYSTEM

(71) Applicant: Dell Products, LP, Round Rock, TX (US)

(72) Inventors: Priyank Gajiwala, Austin, TX (US); Michiel Knoppert, Amsterdam (NL); Thomas M. Hinskens, Utrecht (NL)

(73) Assignee: Dell Products, LP, Round Rock, TX (US)

( * ) Notice: Subject to any disclaimer, the term of this patent is extended or adjusted under 35 U.S.C. 154(b) by 1 day.

(21) Appl. No.: 16/779,546

(22) Filed: Jan. 31, 2020

(65) Prior Publication Data
US 2021/0240282 A1    Aug. 5, 2021

(51) Int. Cl.
*G06F 3/02*     (2006.01)
*G06F 3/01*     (2006.01)
(Continued)

(52) U.S. Cl.
CPC ............ *G06F 3/0202* (2013.01); *G06F 3/016* (2013.01); *H01H 13/7065* (2013.01);
(Continued)

(58) Field of Classification Search
CPC ... G06F 3/0202; G06F 3/016; H01H 13/7065; H01H 13/85; H01H 2215/052; H03K 17/967
See application file for complete search history.

(56) References Cited

U.S. PATENT DOCUMENTS 4,618,797 A    10/1986   Cline
4,857,887 A    8/1989    Iten
(Continued)

FOREIGN PATENT DOCUMENTS

JP    2014164610 A    9/2014
KR    100442116 B1    7/2004
(Continued)

OTHER PUBLICATIONS

Rekimoto, J., et al., "PreSensell: Bi-directional Touch and Pressure Sensing Interactions with Tactile Feedback," Apr. 2006, 6 pages.
(Continued)

*Primary Examiner* — Afroza Chowdhury
(74) *Attorney, Agent, or Firm* — Prol Intellectual Property Law, PLLC; H. Kenneth Prol

(57) ABSTRACT

A keyboard, touchpad, and palm rest haptic response system may comprise a coversheet to identify a keyboard, a touchpad, and a palm rest on a C-cover for an information handling system, a haptic palm rest and touchpad feedback assembly disposed beneath the haptic palm rest area including haptic touchpad, and a haptic keyboard feedback assembly disposed beneath the keyboard. Keyboard controller and palm rest and touchpad controller may receive piezo actuation signals from keyboard piezoelectric elements and touchpad and palm rest piezoelectric elements, respectively, and send a haptic feedback control signals to the respective keyboard piezoelectric elements or palm rest and touchpad piezoelectric elements to cause keyboard haptic feedback or palmrest or touchpad haptic feedback at an actuation location.

20 Claims, 15 Drawing Sheets

(51) Int. Cl.
*H01H 13/7065* (2006.01)
*H01H 13/85* (2006.01)
*H03K 17/967* (2006.01)

(52) U.S. Cl.
CPC .......... *H01H 13/85* (2013.01); *H03K 17/967* (2013.01); *H01H 2215/052* (2013.01)

(56) References Cited

U.S. PATENT DOCUMENTS

| | | | |
|---|---|---|---|
| 5,463,388 | A | 10/1995 | Boie |
| 5,825,352 | A | 10/1998 | Bisset |
| 5,861,583 | A | 1/1999 | Schediwy |
| 5,887,995 | A | 3/1999 | Holehan |
| 6,147,680 | A | 11/2000 | Tareev |
| 6,188,391 | B1 | 2/2001 | Seely |
| 6,239,790 | B1 | 5/2001 | Martinelli |
| 6,532,824 | B1 | 3/2003 | Ueno |
| 6,574,095 | B2 | 6/2003 | Suzuki |
| 6,680,731 | B2 | 1/2004 | Gerpheide |
| 6,703,550 | B2 | 3/2004 | Chu |
| 6,822,635 | B2 | 11/2004 | Shahoian |
| 6,882,337 | B2 | 4/2005 | Shetter |
| 7,336,260 | B2 | 2/2008 | Martin |
| 7,439,962 | B2 | 10/2008 | Reynolds |
| 7,486,279 | B2 | 2/2009 | Wong |
| 7,523,410 | B2 | 4/2009 | Rekimoto |
| 7,535,454 | B2 | 5/2009 | Jasso |
| 7,741,979 | B2 | 6/2010 | Schlosser |
| 7,808,488 | B2 | 10/2010 | Martin |
| 8,144,453 | B2 | 3/2012 | Brown |
| 8,159,461 | B2 | 4/2012 | Martin |
| 8,164,573 | B2 | 4/2012 | DaCosta |
| 8,199,033 | B2 | 6/2012 | Peterson |
| 8,248,277 | B2 | 8/2012 | Peterson |
| 8,248,278 | B2 | 8/2012 | Schlosser |
| 8,279,052 | B2 | 10/2012 | Heubel |
| 8,294,600 | B2 | 10/2012 | Peterson |
| 8,294,677 | B2 | 10/2012 | Wu |
| 8,373,664 | B2 | 2/2013 | Wright |
| 8,477,113 | B2 | 7/2013 | Wu |
| 8,508,487 | B2 | 8/2013 | Schwesig |
| 8,542,134 | B2 | 9/2013 | Peterson |
| 8,581,710 | B2 | 11/2013 | Heubel |
| 8,633,916 | B2 | 1/2014 | Bernstein |
| 8,674,941 | B2 | 3/2014 | Casparian |
| 8,749,507 | B2 | 6/2014 | DaCosta |
| 8,773,356 | B2 | 7/2014 | Martin |
| 8,797,295 | B2 | 8/2014 | Bernstein |
| 8,842,091 | B2 | 9/2014 | Simmons |
| 9,178,509 | B2 | 11/2015 | Bernstein |
| 9,274,660 | B2 | 3/2016 | Bernstein |
| 9,280,248 | B2 | 3/2016 | Bernstein |
| 9,318,006 | B2 | 4/2016 | Heubel |
| 9,336,969 | B2 | 5/2016 | Takashima |
| 9,400,582 | B2 | 7/2016 | Bernstein |
| 9,477,342 | B2 | 10/2016 | Daverman |
| 9,535,557 | B2 | 1/2017 | Bernstein |
| 9,829,982 | B2 | 11/2017 | Bernstein |
| 10,089,840 | B2 | 10/2018 | Moussette |
| 10,120,450 | B2 | 11/2018 | Bernstein |
| 10,860,112 | B1* | 12/2020 | Knoppert ............. G06F 1/1662 |
| 2002/0033795 | A1* | 3/2002 | Shahoian ................ G06F 1/169 |
| | | | 345/156 |
| 2006/0109255 | A1 | 5/2006 | Chen |
| 2007/0063987 | A1 | 3/2007 | Sato |
| 2007/0273671 | A1 | 11/2007 | Zadesky |
| 2008/0098456 | A1 | 4/2008 | Alward |
| 2008/0202824 | A1 | 8/2008 | Philipp |
| 2008/0259046 | A1 | 10/2008 | Carsanaro |
| 2009/0002178 | A1 | 1/2009 | Guday |
| 2009/0243817 | A1 | 10/2009 | Son |
| 2009/0315854 | A1 | 12/2009 | Matsuo |
| 2010/0089735 | A1 | 4/2010 | Takeda |
| 2010/0102830 | A1 | 4/2010 | Curtis |
| 2010/0110018 | A1 | 5/2010 | Faubert |
| 2010/0128002 | A1 | 5/2010 | Stacy |
| 2012/0062491 | A1 | 3/2012 | Coni |
| 2012/0092263 | A1 | 4/2012 | Peterson |
| 2013/0249802 | A1 | 9/2013 | Yasutake |
| 2015/0185842 | A1 | 7/2015 | Picciotto |
| 2017/0269688 | A1 | 9/2017 | Chan |
| 2018/0074694 | A1 | 3/2018 | Lehmann |
| 2019/0073036 | A1 | 3/2019 | Bernstein |
| 2019/0187792 | A1* | 6/2019 | Basehore ............. G06F 3/0436 |
| 2020/0004337 | A1* | 1/2020 | Hendren ............. G06F 3/03547 |
| 2020/0333852 | A1* | 10/2020 | Smith .................. G06F 1/1666 |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-6/03/0010.

Holleis, P. et al., "Studying Applications for Touch-Enabled Mobile Phone Keypads," Proceedings of the Second International Conference on Tangible and Embedded Interaction (TEI'08), Feb. 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

\* cited by examiner

SYSTEM FOR PROVIDING HAPTIC FEEDBACK ACROSS FULL PALM REST IN FIXED POSITION OF INFORMATION HANDLING SYSTEM

FIELD OF THE DISCLOSURE

The present disclosure generally relates to a key switch assembly and touchpad assembly of, for example, an information handling system. The present disclosure more specifically relates to the use of piezoelectric sensor and haptic generator elements in a keyboard and touchpad, as well as across a full palm rest of an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard or other input or output devices such as cursor control devices for manual input of information by the user which may have a streamline profile.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
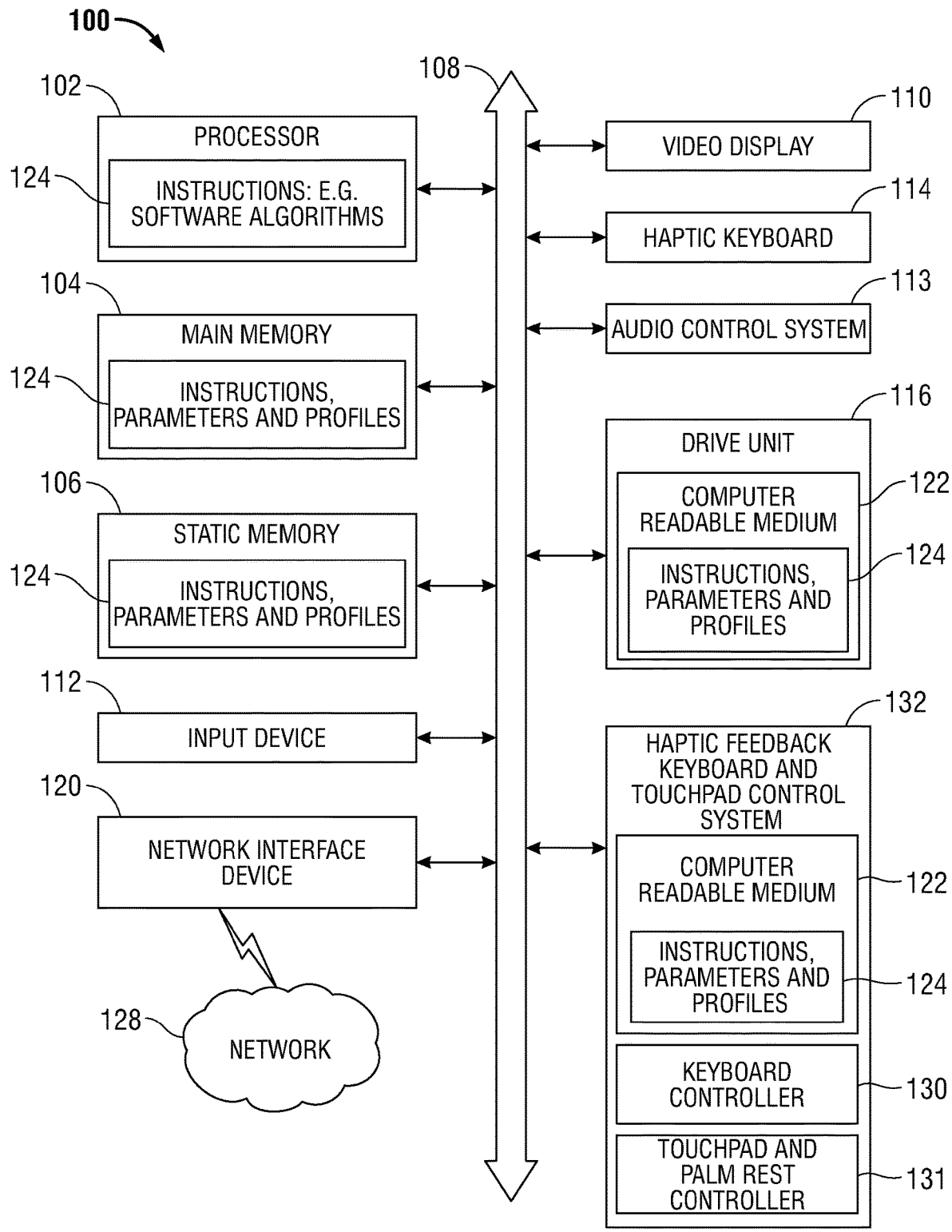
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Embodiments of the present disclosure provide for a combination of a haptic keyboard, haptic touchpad interface, and haptic palm rest of an information handling system. The keyboard may include, in an embodiment, a coversheet to identify an actuation location of an input actuation device. In some embodiments herein, the coversheet may be combined into a single sheet of material including the designation of one or more keys for a keyboard, an area designated for a touchpad, and a palm rest for covering the C-cover of an information handling system. In other embodiments, the coversheet may be combined into a single sheet of material including the designation of a keyboard and a combination haptic touchpad interface and palm rest area. The coversheet may overlay and serve as an interface layer in some embodiments for a user to actuate the one or more keys, the touchpad area, or to rest palms on the C-cover. Local deformation of the key location of the haptic keyboard or the touchpad area provide for actuation of the key or touchpad of the present embodiments.

The keyboard may, in embodiments described herein, include a keyboard contact foil placed between the coversheet and a keyboard support layer. In the embodiments presented herein, the keyboard may include a keyboard piezoelectric element placed between the keyboard contact foil and keyboard support layer to receive an applied mechanical stress at the actuation location of the input actuation device. The keyboard of the information handling system, in an embodiment, may include a keyboard controller of the information handling system operatively coupled to the keyboard contact foil to receive an electric charge in the form of a keyboard piezo actuation signal from the keyboard piezoelectric element placed under the mechanical stress; and send a keyboard haptic feedback control signal to the keyboard piezoelectric element, varying in polarity, voltage or current to cause the keyboard piezoelectric element to provide keyboard haptic feedback at the actuation location.

Some embodiments of the present disclosure incorporate a touchpad in a fixed position, separate from one or more palm rest areas. The touchpad in such an embodiment may, in embodiments described herein, include a capacitive touch layer adhered to a bottom surface of a haptic touchpad interface area within the coversheet. The touchpad may further include a touchpad contact foil placed between the capacitive touch layer and a touchpad support layer. In the embodiments presented herein, the touchpad may include a touchpad piezoelectric element placed between the touchpad contact foil and touchpad support layer to receive an applied mechanical stress at the actuation location of the input actuation device. The touchpad of the information handling system, in an embodiment, may include a palm rest and touchpad controller of the information handling system operatively coupled to the touchpad contact foil to receive an electric charge in the form of a touchpad piezo actuation signal from the touchpad piezoelectric element placed under the mechanical stress; and send a touchpad haptic feedback control signal to the touchpad piezoelectric element, varying in polarity, voltage or current to cause the touchpad piezoelectric element to provide touchpad haptic feedback at the actuation location.

The haptic palm rest may, in embodiments incorporating a touchpad in a fixed position, separate from one or more palm rest areas, include a palm rest contact foil placed between a palm rest area of the coversheet and a palm rest support layer. In the embodiments presented herein, the haptic palm rest may include a palm rest piezoelectric element placed between the palm rest contact foil and palm rest support layer. The haptic palm rest of the information handling system, in an embodiment, may include a palm rest and touchpad controller of the information handling system operatively coupled to the palm rest contact foil to send a palm rest haptic feedback control signal to the palm rest piezoelectric element, varying in polarity, voltage or current to cause the palm rest piezoelectric element to provide palm rest haptic feedback. For example, palm rest haptic feedback in an embodiment may include haptic movement or sound generated in response to a received haptic tactile feedback control signal or haptic tactile feedback control signal or audio signal, or to indicate a notification, alert, or alarm from a currently running software application.

Other embodiments of the present disclosure describe a combination haptic touchpad and palm rest. The combination haptic touchpad and palm rest in such embodiments may include a capacitive touch layer or a reinforcement layer adhered to a bottom surface of a combination haptic touchpad interface and palm rest area within the coversheet. The combination haptic touchpad and palm rest may further include a combination touchpad and palm rest contact foil placed between the capacitive touch layer (or reinforcement layer) and a combination touchpad and palm rest support layer. In the embodiments presented herein, the combination touchpad and palm rest may include a touchpad and palm rest piezoelectric element placed between the combination touchpad and palm rest contact foil and combination touchpad and palm rest support layer to receive an applied mechanical stress at the actuation location of the input actuation device. The combination touchpad and palm rest of the information handling system, in an embodiment, may include a combination palm rest and touchpad controller of the information handling system operatively coupled to the combination touchpad and palm rest contact foil to receive an electric charge in the form of a touchpad piezo actuation signal from the touchpad and palm rest piezoelectric element placed under the mechanical stress; and send a touchpad haptic feedback control signal to the touchpad and palm rest piezoelectric element, varying in polarity, voltage or current to cause the touchpad and palm rest piezoelectric element to provide touchpad haptic feedback at the actuation location. The combination palm rest and touchpad controller of the information handling system may also send a palm rest haptic feedback control signal to the touchpad and palm rest piezoelectric element, varying in polarity, voltage or current to cause the touchpad and palm rest piezoelectric element to provide palm rest haptic feedback, such as haptic movement or sound generated in response to a received haptic tactile feedback control signal or audio signal, or to indicate a notification, alert, or alarm from a currently running software application. In such a way, portions of the palm rest may provide haptic feedback in addition to any haptic feedback felt at the keyboard or touchpad in embodiments described herein.

The use of keyboard piezoelectric elements or touchpad piezoelectric elements within the keyboard may eliminate the use of other devices such as a scissor mechanism that are used to maintain a keycap of a key above an electrical connection or for a dive board type mechanism under a touchpad. Instead, the keyboard piezoelectric elements or touchpad piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid state keyboard of the presently-described information handling system may reduce the physical thickness of the keyboard within the information handling system. This may enable a thinner, more streamlined information handling system. The overall thickness of the information handling system may be reduced to as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid state keyboard or touchpad described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements, the solid state keyboard or touchpad of embodiments herein uses fewer mechanical parts and may be more robust resulting in longer usable life.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard 114, a touchpad, a mouse, a video/graphic display 110, or any combination thereof. The information handling system 100 may include an audio control system 113 to drive audio signals to one or more speaker systems or piezoelectric elements to generate audio haptic feedback. The information handling system 100 may also include one or more buses operable to transmit communications between the various hardware components. Portions of an information handling system 100 may themselves be considered information handling systems 100.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the haptic feedback keyboard and touchpad control system 132, and drive unit 116 (volatile (e.g. random-access memory, etc.), nonvolatile memory (read-only memory, flash memory etc.) or any combination thereof. It is to be appreciated that the haptic feedback keyboard and touchpad control system 132 may be either a haptic feedback keyboard control system 132 for only a haptic keyboard or a haptic feedback touchpad control system 132 for only a haptic touchpad in various embodiment herein. In particular, the haptic feedback keyboard and touchpad control system 132 may be separate system for controlling just a haptic keyboard according to embodiments herein, or for controlling just a haptic touchpad according to embodiments herein, or for controlling both. The haptic keyboard and the haptic touchpad may have separate controllers or processors or share a controller or a processor according to embodiments herein. It is understood that reference to the haptic feedback keyboard and touchpad control system 132 does not necessarily require one system control both the haptic keyboard and the haptic touchpad in embodiments herein. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a keyboard 114. Various drivers and control electronics may be operatively coupled to operate input devices 112 such as the haptic keyboard 114 and haptic touchpad according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a haptic feedback keyboard and touchpad control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the haptic feedback keyboard and touchpad control system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad. The disk drive unit 116 and static memory 106 may also contain space for data storage. Further, the instructions 124 may embody one or more of the methods or logic as described herein. For example, instructions relating to the haptic feedback keyboard and touchpad control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The haptic feedback keyboard and touchpad control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic feedback keyboard and touchpad control system 132 that may be operably connected to the bus 108. The haptic feedback keyboard and touchpad control system 132 computer readable medium 122 may also contain space for data storage. The haptic feedback keyboard and touchpad control system 132 may, according to the present description, perform tasks related to receiving an electric charge from a piezoelectric element and return a piezo actuation signal to that piezoelectric element causing a haptic feedback at a key or location on a touchpad associated with that piezoelectric element. In these embodiments, the haptic feedback keyboard and touchpad control system 132 may receive an electric charge from any of a plurality of piezoelectric elements each associated with a key on keyboard (i.e., a QWERTY or other top overlay keyboard), a keypad, a location on a touchpad, or a location on a haptic palm rest. Input may be received by the haptic feedback keyboard and touchpad control system 132 either simultaneously or concurrently so as to provide a haptic feedback control signal to the corresponding piezoelectric elements as described herein. The haptic feedback keyboard and touchpad control system 132, in embodiments herein, may be a control system for either a haptic feedback keyboard, a haptic feedback palm rest, for a haptic feedback touchpad system, or for some combination as shown in FIG. 1. For example, haptic feedback keyboard and touchpad control system 132 may include only a keyboard controller 130 for a haptic keyboard system or only a touchpad and palm rest controller 131 for a haptic touchpad system and haptic palm rest system in some embodiments that do not implement all types of haptic systems. In other embodiments, both the keyboard controller 130 and touchpad and palm rest controller 131 may be implemented for haptic input output systems as described herein. In further embodiments, a coversheet adaptation system may form part of the haptic feedback keyboard and touchpad control system 132 and may be used to determine the level of force applied to a haptic palm rest or touchpad area to determine when to activate various types of auxiliary haptic palm rest functions such as auxiliary buttons, enhanced stylus haptics during writing, or other haptic feedback systems that may be deployed on the haptic palm rest and touchpad area. In further embodiments, attachment of various available top overlays to change the keyboard language, keyboard layout, or the appearance of the keyboard while still providing a close coupling allow detection of key or touchpad and palm rest actuation and response haptic feedback events to be felt by the users may be further determined by a coversheet adaptation system. The coversheet adaptation system may be operatively coupled to a plurality of Hall effect sensors in such embodiments to determine which type of keyboard top overlay has been attached by sensing the combination of sensed magnets in the coversheet of the C-cover have been paired to a top overlay in some embodiments thereby determining the haptic keyboard area and the haptic touchpad and palm rest area functioning under the coversheet. In further embodiments, the coversheet adaptation system may also determine a polarity of those various magnets.

In an embodiment, the haptic feedback keyboard and touchpad control system 132 may communicate with the main memory 104, the processor 102, the video display 110, the alphanumeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2:
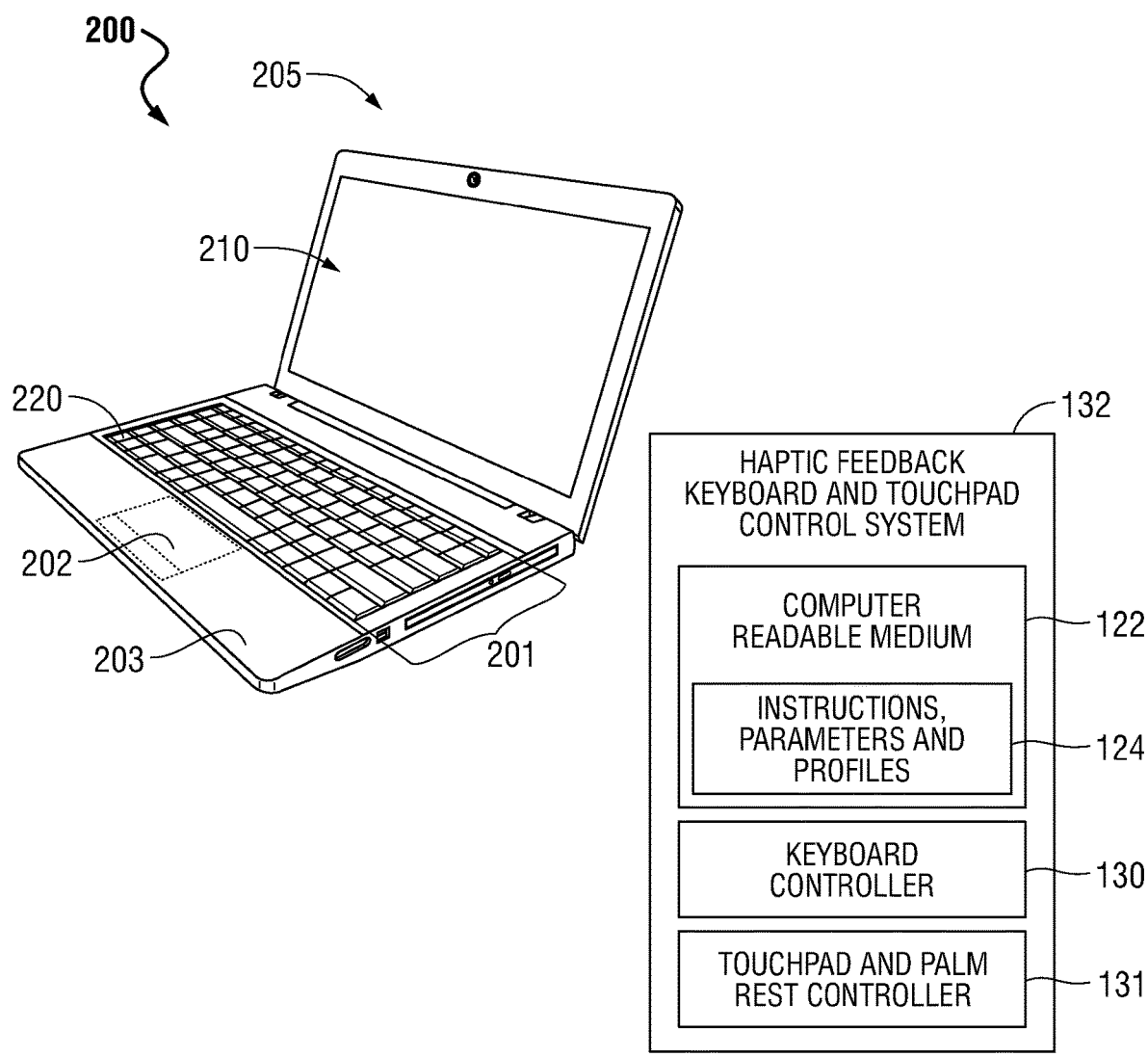
FIG. 2 is a perspective graphical diagram of an information handling system with a haptic feedback control system for a keyboard or palm rest with touchpad according to an embodiment of the present disclosure.

FIG. 2 is a perspective graphical diagram of an information handling system 200 with a haptic feedback keyboard and touchpad control system 132 according to an embodiment of the present disclosure. Although FIG. 2 depicts the information handling system 200 as being implemented in a laptop computing device, FIG. 2 is not meant to be limiting and the present specification contemplates that the use of other types of information handling system as described herein. In the example, the information handling system may include a screen portion 210 and a keyboard portion 201 and a palm rest area that includes a touchpad portion 202. The screen portion 210 may include any device that may present to a user any visual data as output to a user in response to input and execution of the instructions, parameters, and profiles 124 by the processor 102 described in connection with FIG. 1. In an example embodiment, a graphical user interface may be presented to a user to input any number of parameters descriptive of the actuation force used to actuate any number of keys 220 on the keyboard portion 201 of the information handling system, an actuation force at a location on a touchpad 202, or both. The graphical user interface (GUI) may also be used to receive other settings including actuation of a "click" when selecting items on display 210 via a cursor using touchpad 202, setting the force required for actuation, setting multiple-levels of force and operations associated with those levels, and selection of magnitude, pattern, or other characteristics of the haptic response by a key 220 of the keyboard 201, or by the palm rest area 203 that includes touchpad 202 and may include further haptic palm rest functions such as force activated auxiliary keys, stylus writing haptic feedback, weight measurement applications. Further, the palm rest area 203 may function as additional audio feedback sources in some embodiments.

The keyboard portion 201 may include any number of keys 220 arranged in any manner so as to receive input from a user via selective actuation of those keys 220. In an embodiment, the keys 220 may be arranged similar to a QWERTY-type keyboard layout or any other alphabetic, symbolic, or numeric layout. In an embodiment, the keys 220 may be any number of keys from 1 to infinity. In another embodiment, the keyboard portion 201, the touchpad 202 and palm rest area 203 and other portion of the C-cover may be made of a single sheet of material as a coversheet of the stack up of the piezoelectric keyboard and piezoelectric touchpad and palm rest area as described in systems herein. This single sheet of material may be made of metals such as aluminum, titanium, steel or the like or may be made of carbon fiber or plastics to provide for flexible materials. Other materials may include bamboo, wood, cloth or other woven material, ceramic, glass or similar materials to provide for chosen aesthetics for the information handling system. Depending on thickness of the coversheet material of the haptic palm rest area 203 including touchpad 202, the piezoelectric elements supporting the haptic palm rest area 203 and haptic touchpad 202 may be utilized to detect force applied to those area. The coversheet adaptation system may be a part of the haptic feedback keyboard and touchpad control system 132 may operate to execute code instructions via a controller or processor to detect the force levels applied to the haptic palm rest area 203. If a threshold level of force is applied to the haptic palm rest area 203, the coversheet adaptation system may activate auxiliary functions of the haptic palm rest area 203, and which may include the integrated haptic touchpad 202, and provide actuation detection and haptic tactile or audio feedback to a user via the piezoelectric elements. If the coversheet material is thicker or stiffer in some embodiments, separate dedicated force sensors such as quantum tunneling composite (QTS) or thin file resistor layer may need to be used to detect force thresholds but still allow auxiliary functions of the haptic palm rest area 203 depending on threshold.

In some other embodiments, the coversheet adaptation system may convert the haptic palm rest area into an active haptic feedback input/output device when a threshold is met or provide palm rejection when the applied force is below the threshold level. The coversheet adaptation system may also convert operation of the integrated haptic touchpad 202 in the haptic palm rest area 203 in some embodiments to provide a full haptic palm rest area for some functions such as writing with a stylus.

In yet other embodiments, a top overlay may be used to swap out type of keyboard 201 or haptic palm rest area with included touchpad 202 used for the information handling system. For example, a top overlay may be used for replacing a QWERTY-type keyboard with a keyboard for another language. A coversheet adaptation system may be a part of the haptic feedback keyboard and touchpad control system 132 may operate to execute code instructions via a controller or processor to detect the top overlay attached to the coversheet of the C-cover and adjust underlying piezoelectric elements to adjust to the top overlay detected. The coversheet adaptation system may be operatively coupled to one or more Hall effect sensors, a light or infrared sensor, or other proximity sensor to determine that a top overlay has been attached via magnets or even which type of top overlay has been attached to the coversheet. Then the coversheet adaptation system may adjust the interpretation of actuation of the piezoelectric element or elements corresponding to each key or keys of the new keyboard of the top overlay to interpret a piezo actuation signal to represent a designated character on the top overlay. In other aspects, the top overlay may be used to vary shapes of keys or touchpad, layout of keys or touchpad, texture or materials or colors in various embodiments. In such embodiments, the coversheet adaptation system may detect the top overlay attached as described if changes to interpretation of piezoelectric element actuation reflects a changed character designation on the top overlay due to change in language and alphanumeric characters or changes in location of keys or sizes of keys.

In an embodiment of the present description, each of the keys 220 may be associated with a piezoelectric element or more than one piezoelectric element. The piezoelectric element may be used to, as described herein, create a piezo actuation signal relative to a key 220 on the keyboard portion 215 and send that piezo actuation signal to a controller. In an embodiment, the controller may receive the electrical signal and send an electrical signal to the piezoelectric element. Upon application of the electrical signal at the piezoelectric element (i.e., having a specific current and voltage) associated with the actuated key 220 causes the piezoelectric element to convert that piezo actuation signal into a mechanical stress by, for example, warping the piezoelectric element. The mechanical stress of the piezoelectric element due to the application of the piezo actuation signal to the piezoelectric element may be felt by a user who actuated the key 220 or location on the touchpad.

In an embodiment, the haptic palm rest area 203 including a touchpad portion 202 includes a touch surface and a capacitive touch layer that indicates a touch location using x- and y-coordinates across the touch surface. In an embodiment, an array of piezoelectric elements may be placed under the haptic palm rest area 203 including a touchpad portion 202. Each of the piezoelectric elements among the array may detect and respond by providing haptic feedback depending on the piezoelectric elements' proximity to an actuation location across the surface of the touch layer. For the palm rest area 203 that is not the included touchpad portion 202, actuation may depend on a threshold level of force applied or else palm rejection may operate there. The array of piezoelectric elements activates the haptic palm rest area 203 including a touchpad portion 202 and a detect/response is provided by one or more nearby piezoelectric elements. The piezoelectric elements create a "click" haptic feedback such as when a user selects an item displayed with the haptic touchpad 202. Any variety of haptic tactile feedback or audio feedback may be generated at the haptic palm rest area 203 including a touchpad portion 202 according to embodiments herein.

The information handling system 200 may include a haptic feedback keyboard and touchpad control system 132 as described herein. In an embodiment the keyboard controller 130 and the palm rest and touchpad controller 131 may be the same controller that executes instructions, parameter, and profiles 124 to enact the functions of the keyboard 114 and haptic palm rest including touchpad as described herein. In an embodiment the keyboard controller 130 and the palm rest and touchpad controller 131 may be the different controllers that each executes instructions, parameter, and profiles 124 to enact the functions of the keyboard 201 and the haptic palm rest area 203 and touchpad 202 as described herein. In an embodiment, the haptic feedback keyboard and touchpad control system 132 may include one or more sets of instructions that, when executed by a keyboard controller 130, causes a current, at a voltage, to be applied to a piezoelectric element upon detection of a piezo actuation signal from the piezoelectric element. The one or more sets of instructions of the haptic feedback keyboard and touchpad control system 132 may also include one or more sets of instructions that, when executed by the keyboard controller 130, determines which of any plurality of keys 220 on a keyboard portion 201 or locations on a palm rest area 203 including touchpad 202 were activated by association of a scan code of the one or more piezoelectric elements to an alphanumeric character associated with such a key. In further embodiments, the one or more sets of instructions of the haptic feedback keyboard and touchpad control system 132 may also include one or more sets of instructions of the coversheet adaptation system that, when executed by the keyboard controller 130 or a processor, determines whether a threshold level of force has been received at the haptic palm rest area 203 including a touchpad portion 202 to activate auxiliary functions. The coversheet adaptation system may also determine which of any of the top overlays has been attached to the coversheet over an existing default keyboard (such as a QWERTY-type keyboard or over a flat coversheet) via magnetic or other attachment and with an sensors able to detect the attachment to adapt the keyboard location and the haptic palm rest area 203 including a touchpad portion 202 locations on the C-cover for the underlying piezoelectric elements. The coversheet adaptation system in some embodiments may operate to adjust the scan code designation of received actuation signals from piezo electric elements when the set of alphanumeric keys and locations of the top overlay.

The present embodiments also contemplate that only a haptic feedback keyboard 201 or only a haptic feedback touchpad 202 may be deployed into the information handling system with the other of the haptic feedback keyboard 201 or haptic feedback touchpad 202 being embodied as a conventional touchpad or keyboard. In an example, the keyboard controller 130 may receive, from a piezoelectric element, an electric charge and produce an electric charge to the piezoelectric element. The haptic feedback and touchpad control system 132 may also include a palm rest and touchpad controller 131. In an embodiment, the palm rest and touchpad controller 131 of the control system 132 may include one or more sets of instructions that, when executed by a palm rest and touchpad controller 131, causes a current, at a voltage, to be applied to a piezoelectric element upon detection of a piezo actuation signal from the piezoelectric element.

In an embodiment, the one or more sets of instructions of the haptic feedback keyboard and touchpad control system 132 may also include, in an embodiment, one or more sets of instructions that, when executed by a processor, adjusts the polarity, voltage, or current of haptic feedback control signals applied to any piezoelectric element. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the piezo actuation signal applied any given piezoelectric element by the keyboard controller 130 may be customized to produce a specific level of haptic feedback at any given key or portion of the haptic palm rest area 203 including a touchpad portion 202. In an embodiment, the keyboard controller 130 of the information handling system 200 may include a look-up table. In this embodiment, the keyboard controller 130 of the information handling system 200 may access the look-up table in order to determine how a current pulse is to be applied to any given piezoelectric element and at what polarity or voltage of the haptic feedback control signal to the piezoelectric elements.

The one or more sets of instructions of the haptic feedback keyboard and touchpad control system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key 220 on a keyboard portion 201 of the information handling system or changes in magnitude or pulses of haptic feedback to emulate the feel of a mechanical keystroke including adjustment of the feel of depth of the haptic-emulated keystroke. In other embodiments, the haptic feedback of the keyboard 201 may not need to emulate a keystroke of a mechanically actuated keyboard but instead provide a distinct haptic feel to indicate that a keystroke has occurred on the solid state keyboard 201 to the user.

In an embodiment, the one or more sets of instructions of the haptic feedback keyboard and touchpad control system 132 may also include, in an embodiment, one or more sets of instructions that, when executed by a processor, adjusts the voltage and current applied to any piezoelectric element at a touchpad portion 202. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the piezo actuation signal applied any given piezoelectric element by the palm rest and touchpad controller 131 may be customized to produce a specific level of haptic feedback at any given location across haptic palm rest area 203 including a touchpad portion 202. In an embodiment, the palm rest and touchpad controller 131 of the information handling system 200 may include a look-up table. In this embodiment, the palm rest and touchpad controller 131 of the information handling system 200 may access the look-up table in order to determine how a current pulse is to be applied to any given piezoelectric element and at what polarity or voltage of the haptic feedback control signal to the piezoelectric elements.

The one or more sets of instructions of the haptic feedback keyboard and touchpad control system 132 may also include one or more sets of instructions that, when executed by the palm rest and touchpad controller 131, causes any number of subsequent current pulses to be applied to any piezoelectric element. In this embodiment, the subsequent electrical pulses may cause a haptic feedback event to a user who actuated a location across haptic palm rest area 203 including a touchpad portion 202 of the information handling system or changes in magnitude or pulses of haptic feedback to emulate the feel of a mechanical actuation of a touchpad portion 202 including adjustment of the feel of depth or click response of the haptic-emulated actuation of the touchpad portion 202. In other embodiments, the haptic feedback of the haptic palm rest area 203 including a touchpad portion 202 may not need to emulate a click of a mechanically actuated touchpad but instead provide a distinct haptic feel to indicate that a haptic palm rest area 203 including a touchpad portion 202 actuation has occurred to the user.

In an embodiment, the application of any current and voltage applied to any of the piezoelectric elements associated with any of the keys 220 or a location on a haptic palm rest area 203 including a touchpad portion 202 may be dependent on an application being executed on the laptop computing device 205. By way of example, a user may be engaged in providing input, via the keys 220 of the keyboard portion 215, to a processor of the laptop computing device 205 in order to cause output to be provided. In a specific embodiment, the laptop computing device 205 may execute a basic input/output system (BIOS). Upon execution of the BIOS, the haptic feedback keyboard and touchpad control system 132 may begin to detect electrical signals or charges emitted from a piezoelectric element being placed in a strain by the actuation of a corresponding key 220 on the keyboard portion 215 or location on the haptic palm rest area 203 including a touchpad portion 202. This may allow the haptic feedback keyboard and touchpad control system 132 to receive input at times when the laptop computing device 205 is in an on states. In an alternative embodiment, the execution of other application programs by a processor of the laptop computing device 205 such as word processing application program may trigger the haptic feedback keyboard and touchpad control system 132 to begin to detect the piezo actuation signals produced at any given piezoelectric element. By deferring input received from the piezoelectric element at the keyboard controller 130 or any other controller or processor, accidental input may be prevented by any errant touch of the keyboard portion 215.

Figure 3A:
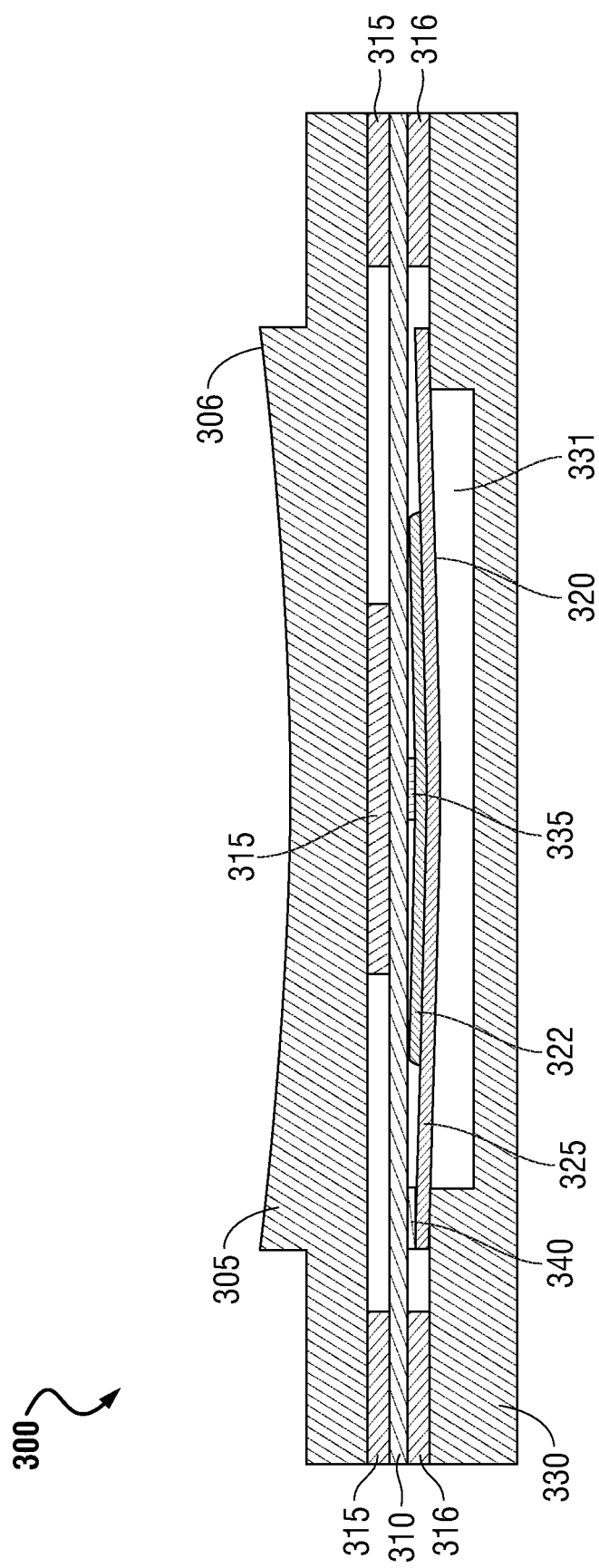
FIG. 3A, is a side cut-out view of a force-sensing surface of a haptic keyboard coversheet implementing a piezoelectric element according to an embodiment of the present disclosure.
Figure 3B:
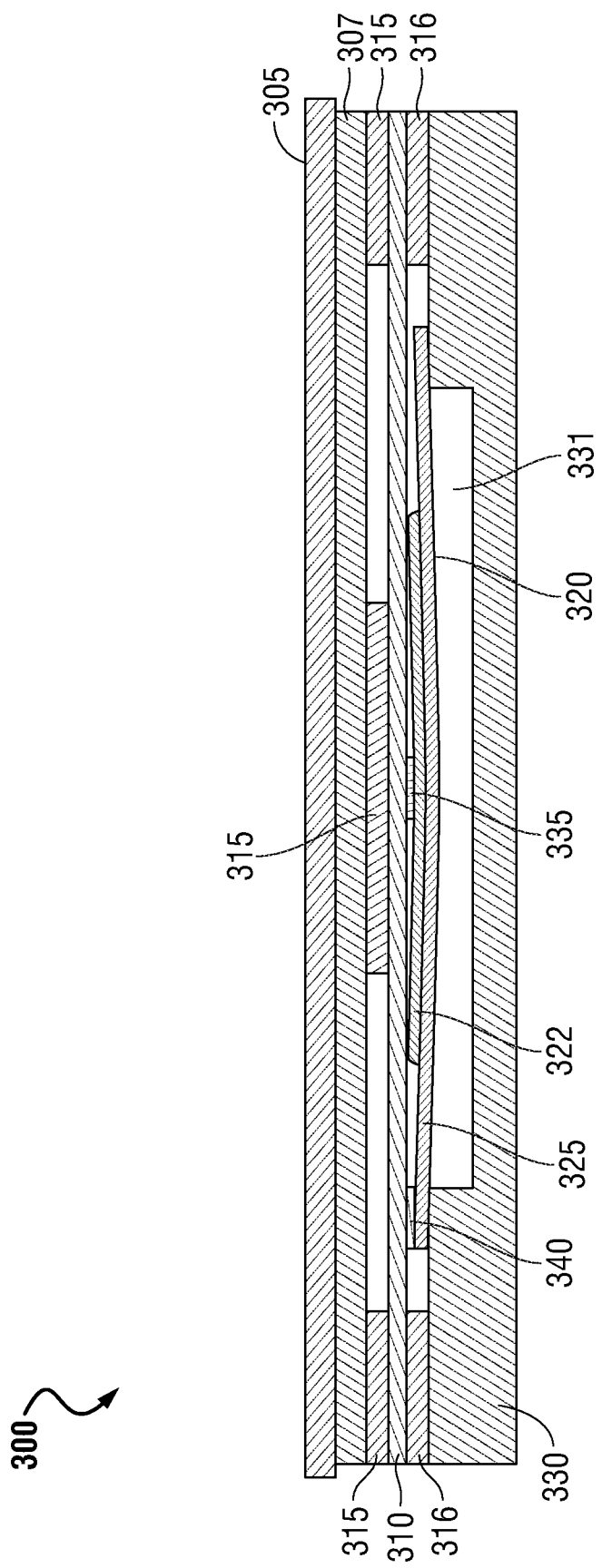
FIG. 3B is a side cut-out view of a force-sensing surface of a touchpad or palm rest implementing a piezoelectric element according to an embodiment of the present disclosure.

FIGS. 3A, and 3B are side cut-out views of a force-sensing surface of a haptic keyboard coversheet implementing a piezoelectric element according to an embodiment of the present disclosure. FIG. 3A depicts a force-sensing surface 300 of a haptic keyboard implementing a piezoelectric element 320 in an unactuated state according to an embodiment of the present disclosure. FIG. 3B depicts a force-sensing surface 300 of a touchpad or palm rest implementing a piezoelectric element 320 including a top overlay on a coversheet according to an embodiment of the present disclosure. According to an embodiment, the force-sensing surface 300 (e.g., key, touchpad, or palm rest) may be formed of a plurality of layers, one layer of which is a piezoelectric element 320. Although FIG. 3A shows a cross-sectional view of a single force-sensing surface 300 (e.g., key), the present specification contemplates that a keyboard may also include a plurality of these similar keys 300 arranged as, for example, a QWERTY-type keyboard. The present specification also contemplates that, in addition to a keyboard, an information handling system described herein may also include a haptic palm rest including a haptic touchpad portion and including a piezoelectric element 320 as described herein with respect to FIG. 3B. Consequently, FIGS. 3A and 3B are not intended to be limiting but merely intended as a description of operation of any type of input device contemplated by the present disclosure.

In embodiments described with reference to FIGS. 3A and 3B, the force-sensing surfaces 300 (e.g., key, touchpad, or palm rest) include a coversheet 305. The coversheet 305 may be made of any type of elastically resilient material. The elastically resilient material may allow, at least, a portion of the force-sensing surface 300 (e.g., key) to be deformed upon application of a pressure from a user's finger. Upon withdraw of the pressure from the user's finger, the material the coversheet 305 is made of allows the coversheet 305 of the force-sensing surface 300 (e.g., key) to bend back to its pre-deformed state. In an embodiment, the resilient material may allow the coversheet 305 to travel a minimal distance and still deform a piezoelectric element 320. For example, a distance of between 0.01 mm and 2 mm may be compressed in the stackup including the coversheet 305 and piezoelectric element. In an embodiment, the distance is between 0.05 mm and 0.15 mm. In an embodiment, the distance is 0.1 mm. The piezoelectric element 320 may deform between 5 microns and 30 microns in some embodiments.

In an embodiment described with reference to FIG. 3A, the shape of the coversheet 305 may have a selection of key pedestals 306 of various sizes and shaped so as to conform to a user's finger. In such an embodiment, in order to shape the coversheet 305, the material used to form the coversheet 305 may be subjected to an injection molding process. As such, a top portion of the coversheet 305 may be formed to be ergonomically beneficial to a user's actuation such as by conforming to the user's fingers and including a pedestal 306 to highlight the key location, for example. In other embodiments, no key pedestals may be formed and a key location may be described in coversheet 305 via markings, depressions, key framing, or other methods. The injection molding process may be completed prior to the installation of the coversheet 305 into the remaining layers within the keyboard 300 as described herein. Any number of processes may be included with the injection molding process. In an embodiment, the injection molding process used to form the coversheet 305 may include forming a number of holes within a sheet of acrylonitrile butadiene styrene (ABS). These holes may correlate with a number of keys on a keyboard. The formation of the coversheet 305 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard.

In yet other embodiments, coversheet of the C-cover may include a plurality of vias for keys 300 having a cover sheet 305 or cap for each key. A key pedestal 306 for each force-sensing surface 300 (e.g., key) in a solid state keyboard of the present embodiments may be disposed through the vias in the C-cover in such embodiments. Keys 300 may include small gaps that may be available for base chassis ventilation, or for allowing backlight framing of keys in some embodiments.

In an embodiment described with reference to FIG. 3B, the force-sensing surface 300 (e.g., touchpad or palm rest) may include a coversheet 305 and, in some embodiments, a top overlay layer. The coversheet layer 305 in some embodiments may be made of an elastically resilient material. The thickness of the coversheet 305 may determine how force is sensed at a haptic palm rest including a haptic touchpad area. If for example, a thinner coversheet 305 or more flexible coversheet 305 is used for the palm rest area including touchpad, the piezoelectric elements 320 may be used to detect force applied to activate auxiliary haptic palm rest operations. In other embodiments, a more stiff or solid feed to the flexible coversheet 305 of the palmrest area may be desirable. In such embodiments, a thicker coversheet or stiffer coversheet material may be used. With a thicker coversheet, for example greater than 1.5 mm thick, a stiffer coversheet 305, or an overlay layer used, the cover sheet layer 305 may include a thin layer of a force-sensing material 307, such as, for example, a thin film incorporating a force-sensing resistor, such as a quantum tunneling composite thin film or force sensing resistor thin film in some embodiments to enhance or ensure force level detection. The coversheet 305 may be part of a single material coversheet disposed atop the touchpad region alone, the palm rest region alone, or atop both the touchpad and palm rest regions. The elastically resilient material may allow, at least, a portion of the force-sensing surface 300 (e.g., e.g., touchpad or palm rest) to be deformed upon application of a pressure from a user's finger or palm. Upon withdraw of the pressure from the user's finger or palm, the coversheet material allows the coversheet 305 and any top overlay layer to bend back to its pre-deformed state. In an embodiment, the resilient material may allow application of actuation pressure to the coversheet 305 to travel a minimal distance and still deform a piezoelectric element 320. For example, a distance of between 0.01 mm and 2 mm may be compressed in the stackup including the coversheet 305 and piezoelectric element. In an embodiment, the distance is between 0.05 mm and 0.15 mm. In an embodiment, the distance is 0.1 mm. The piezoelectric element 320 may deform between 5 microns and 30 microns in some embodiments. In an embodiment, a top overlay layer may be installed on the coversheet 305 by adhering the top overlay layer to the coversheet 305 via magnetic attachment or other affixable and removable attachment such as adhesives or the like according to embodiments herein. The coversheet 305 may be adhered into the remaining layers within the keyboard 300 as described herein such as via adhesive 315 in an embodiment.

With respect to the haptic key of FIG. 3A, the formation of the force-sensing surface 300 (e.g., touchpad, palm rest) with a top overlay layer (not shown) may, in the embodiments presented herein, also provide for a keyboard that has a relatively shorter distance of key travel as compared to those keyboards that implement mechanical devices such as a scissor mechanisms and key caps. The top overlay in such embodiments is tightly aligned to the coversheet 305 of a haptic keyboard via the magnetic or other reusable attachment such as reusable adhesives or magnets in some embodiments. The tight alignment of the top overlay of such an overlay embodiment on the coversheet 305 provides a close haptic feel and response and is not dictated by the key travel required for most mechanically actuated keys. Thus, the top overlay of a haptic key of the present embodiment of FIG. 3A may also avoid any hollow travel of previous overlays to accommodate the travel of mechanically actuated keys. Thus, in an embodiment, the distance of travel of the force-sensing surface 300 (e.g., touchpad or palm rest) may be smaller than 0.1 mm and this may include with the top overlay layer. With the shorter distance of key travel, the overall thickness of the keyboard placed within an information handling system may be reduced. Thus, the actuation needed to register a keystroke with the piezoelectric element 320 or elements of force-sensing surface 300 (e.g., key) and the feel of the haptic feedback response event from the piezoelectric element 320 may remain similar to that of a system with just a coversheet layer 305 such as in embodiments of FIG. 3A.

In embodiments described with reference to FIGS. 3A and 3B, the force-sensing surface 300 (e.g., key, touchpad, or palm rest) may further include a number of adhesive layers 315 that physically couple the various layers of the force-sensing surface 300 (e.g., key, touchpad, or palm rest) together. In an embodiment, a first adhesive layer 315 may be formed on the coversheet 305 to adhere the coversheet 305 to a contact foil 310. The first adhesive layer 315 may include the placement of the adhesive at locations that may enhance the movement and prevent the hinderance of the actuation of the coversheet 305. In a specific embodiment, the first adhesive layer 315 may include placing the adhesive along borders of the force-sensing surface 300 (e.g., key, touchpad, or palm rest) as well as placing the adhesive at a central location of the force-sensing surface 300 (e.g., key, touchpad, or palm rest).

The contact foil 310 adhered to the coversheet 305 in embodiments described with reference to FIGS. 3A and 3B via the first layer of adhesive 315 may be made of any elastically resilient material that, when the coversheet 305 of force-sensing surface 300 (e.g., key, touchpad, or palm rest) is actuated or the contact foil 310 is bent towards a lower portion of the force-sensing surface 300 (e.g., key, touchpad, or palm rest), returns to its original state when the force-sensing surface 300 (e.g., key, touchpad, or palm rest) is no longer being actuated. The contact foil is a flexible material, such as polyethylene terephthalate (PET) serving as a polyester printed circuit board or other type of flexible printed circuit board, in several example embodiments. The contact foil 310 may include a number of metal traces formed thereon that electrically and communicatively couple each of the corresponding piezoelectric element 320 of force-sensing surface 300 (e.g., key, touchpad, or palm rest) to a controller such as a processor of an information handling system that includes a haptic feedback keyboard control system such as described herein. Formation of metal traces may be made according to a variety of methods including photolithographic techniques for applying metal or lamination of copper strips or other metal layers. During operation of the force-sensing surface 300 (e.g., key, touchpad, or palm rest), the contact foil 310 may receive a piezo actuation signal from the piezoelectric element 320 at the metal traces that conduct the piezo actuation signal to the processor or other controller associated with the force-sensing surface 300 (e.g., key, touchpad, or palm rest). The metal traces formed on the contact foil 310 may further be used to conduct a haptic feedback control signal from the controller to the piezoelectric element 320 so that the voltage and current of the haptic feedback control signal may cause the piezoelectric element 320 to warp upward and downward before returning to a planar and rigid form of the piezoelectric element 320 as would be required to cause a specified haptic feedback to the user via coversheet 305. This actuation causing warping of the piezoelectric element 320 may cause a haptic feedback presented at the force-sensing surface 300 (e.g., key, touchpad, or palm rest) via the contact foil 310, adhesive 315, and coversheet 305 that the user may feel. This haptic feedback may be relayed to the user within microseconds of the user actuating the force-sensing surface 300 (e.g., key, touchpad, or palm rest) such that the user physically detects a sensation that the force-sensing surface 300 (e.g., key, touchpad, or palm rest) was pressed. This sensation felt by the user may be present despite no actual mechanical devices such as a scissor mechanism or other types of keyboard mechanical devices being present among the layers of the force-sensing surface 300 (e.g., key, touchpad, or palm rest). The signal to the piezoelectric element 320 may vary magnitude and pulsing to create the desired haptic response at force-sensing surface 300 (e.g., key, touchpad, or palm rest). In an embodiment, portions of the contact foil 310 may be physically coupled to a support plate 330 via a second layer of adhesive 316. The location of the placement of the second adhesive layer 316 may include placing the adhesive along borders of the force-sensing surface 300 (e.g., key, touchpad, or palm rest).

In an embodiment presented herein and illustrated in FIGS. 3A and 3B, the piezoelectric element 320 may include a first portion 322 that may be any solid piezoelectric material that accumulates an electric charge when a mechanical stress is applied to it or specifically, in the embodiments presented herein, when the solid material is deformed. Solid materials used to form the piezoelectric element 320 may include crystals, ceramics, or protein layers, among other types of materials. For ease of explanation, the piezoelectric element 320 may be made of a type of ceramic although the present specification contemplates the use of other types of piezoelectric materials.

The piezoelectric element 320 may be housed over a cavity 331 formed in the support plate 330. The piezoelectric element 320 may comprise two portions 322 and 325 each electrically coupled via electric contact points such as soldering points 335 and 340, respectively, to a different electrical trace on a contact foil 310. The first portion 322 may be a ceramic disc in an embodiment. Second portion 325 of the piezoelectric element 320 may be a metal plate or ring, such as a brass plate, that extends beyond the edges of cavity 331. The first portion 322 and the second portion 325 may be operatively coupled via adhesive including conductive adhesives. The soldering points 335 and 340 may be silver solder contact points for operative electrical coupling to metal traces on contact foil 310. The brass plate 325 supports deflection of the piezoelectric element 320 into the cavity 331 to detect mechanical actuation of the force-sensing surface 300 (e.g., key). In an embodiment, the support plate 330 may have cavity 330 formed therein such that the piezoelectric element 320 may be allowed to be deflected therein when the force-sensing surface 300 (e.g., key) is actuated by a user and cavity 331 may be an aperture or hole through support plate 330 or may be a depression or hole in support plate 330 that does not pass through 330.

The piezoelectric element 320 may be electrically and communicatively coupled to the metal traces formed on the contact foil 310 via a metallic connection points 335 and 340 such as a solder dot. In a specific embodiment, the piezoelectric element 320 may be electrically and communicatively coupled at a first portion 322 to a metallic trace formed on the contact foil 310 by a first soldering point 335 and at a second portion 325 to a metallic trace in contact foil 310 via a second soldering point 340. The soldering points 335 and 340 may be silver contact points for making electrical contact to first portion 322 and second portion 325 of the piezoelectric element 320. As so oriented, the first soldering point 335 and second soldering point 340 may be formed to receive a piezo actuation signal upon deflection of the piezoelectric element 320 as a user actuates the force-sensing surface 300 (e.g., key, touchpad, or palm rest) and the electrical charge accumulates at the piezoelectric element 320. As described herein, the piezo actuation signal may be detected by the controller as received from the electrically conductive metal traces and portions 322 and 325.

Upon receiving a piezo actuation signal, the controller sends a haptic feedback control signal back to the piezoelectric element 320 via the metal traces formed on the contact foil 310, through the soldering points 335 and 340 and to a conductive layer of metallic plate or ring 325 formed below the piezoelectric disk material 322. The conductive layer of metallic plate or ring 325 may apply the haptic feedback control signal to the piezoelectric disk material 322 so as to cause the piezoelectric disk material 322 to stretch or shrink depending on the polarity of the signal applied. For example, a negative voltage haptic feedback control signal applied to piezoelectric disk material element 322 relative to the charge at adhesively attached metallic plate 325 may cause piezoelectric disk 322 to expand or stretch in embodiments herein. This may cause metallic plate 325 to warp downward. Reversing polarity to the piezoelectric disk 322 may cause the piezoelectric disk 322 to compress or shrink and metallic plate 325 may warp upwards. The principle of haptics applied to the piezoelectric disk 322 includes an input voltage as applied through the two electrodes (voltage change as sine wave, square wave etc.) to generate movement on piezoelectric material 322 of the piezoelectric element 320 and a warping of the metallic layer or disk 325. This haptic feedback control signal is used to cause a haptic tactile feedback such as a depression and return of the force-sensing surface 300 (e.g., key) or a haptic "click" of a touchpad and which may be accompanied by a sound. Such a haptic feedback control signal, such as a sine wave signal, or other haptic feedback control signal with varying polarities or voltage and current may be used by the controller to create the haptic feedback felt by the user as described herein. In these embodiments, the electric charge sent from the piezoelectric element 320 to the controller and the electrical signal sent from the controller to the piezoelectric element 320 may propagate along the two metal traces formed on the contact foil 310. The contact foil 310 may therefore, in an embodiment, include double the number of metal traces as that of the number of piezoelectric elements 320 used to form a keyboard that includes multiple keys 300 or multiple portions of the touchpad or palm rest.

FIG. 3A shows an image of a single force-sensing surface 300 (e.g., key). The present specification contemplates that a plurality of keys 300 may be formed alongside each other in order to form, for example, a number pad, a keyboard, or a combination thereof. Consequently, although the features of the force-sensing surface 300 (e.g., key) depicted in FIG. 3A apply to a single force-sensing surface 300 (e.g., key), the present specification contemplates that any number of keys 300 may be formed on the keyboard so as to allow for the formation of an input device such as a keyboard. The keys 300 may be of any size (e.g., spacebar, tab key, or the like) and depending on size may include more than one piezoelectric element 320 associated with it. Further, FIG. 3B shows an image of a single force sensing surface 300 (e.g., touchpad or palm rest). The present specification contemplates that a plurality palm rest and touchpad piezoelectric elements in an array to support function of such palm rests, combinations of one or more palm rests with a touchpad, combinations of a touchpad and a keyboard, or combinations of one or more palm rests with a touchpad and a keyboard may be formed alongside each other in order to form one or more haptic input devices. As the user actuates each of the keys, touchpad, or palm rest, a haptic feedback may be felt by the user so as to present to the user a sensation that the key was pressed, or the touchpad was clicked.

The formation of the force-sensing surface 300 (e.g., key) may, in the embodiments presented herein, provide for a keyboard that has a relatively shorter distance of key travel as compared to those keyboards that implement mechanical devices such as a scissor mechanisms and key caps. In an embodiment, the distance of travel of the force-sensing surface 300 (e.g., key) may be smaller than 0.1 mm. With the shorter distance of key travel, the overall thickness of the keyboard placed within an information handling system may be reduced. Similarly, formation of the force-sensing surface 300 (e.g., touchpad) may, in the embodiments presented herein, provide for a touchpad that is relatively thinner as compared to those touchpads that implement linear resonance magnet devices to deliver haptic feedback, as linear resonance magnet devices tend to be thicker than piezoelectric element haptic feedback stacks. This increases the available footprint within a base chassis of, for example, a notebook-type information handling system that may be used for more or larger components (e.g., batteries) to be placed within the base chassis. Additionally, or alternatively, the reduction in thickness of the keyboard, touchpad, and palm rest may reduce the overall thickness of the information handling system improving the aesthetics of the design of the information handling system. This reduction in size of the information handling system may also result in the reduction of the weight of the information handling system thereby increasing the portability of the information handling system by the user.

The keys 300 of the present embodiment described with reference to FIG. 3A also include no moving mechanical parts. With the absence of mechanical moving parts, the force-sensing surface 300 (e.g., key) of such an embodiment may be relatively more robust thereby increasing the useful life of the force-sensing surface 300 (e.g., key). This may increase user satisfaction over the useful lifetime of the information handling system.

Figure 4:
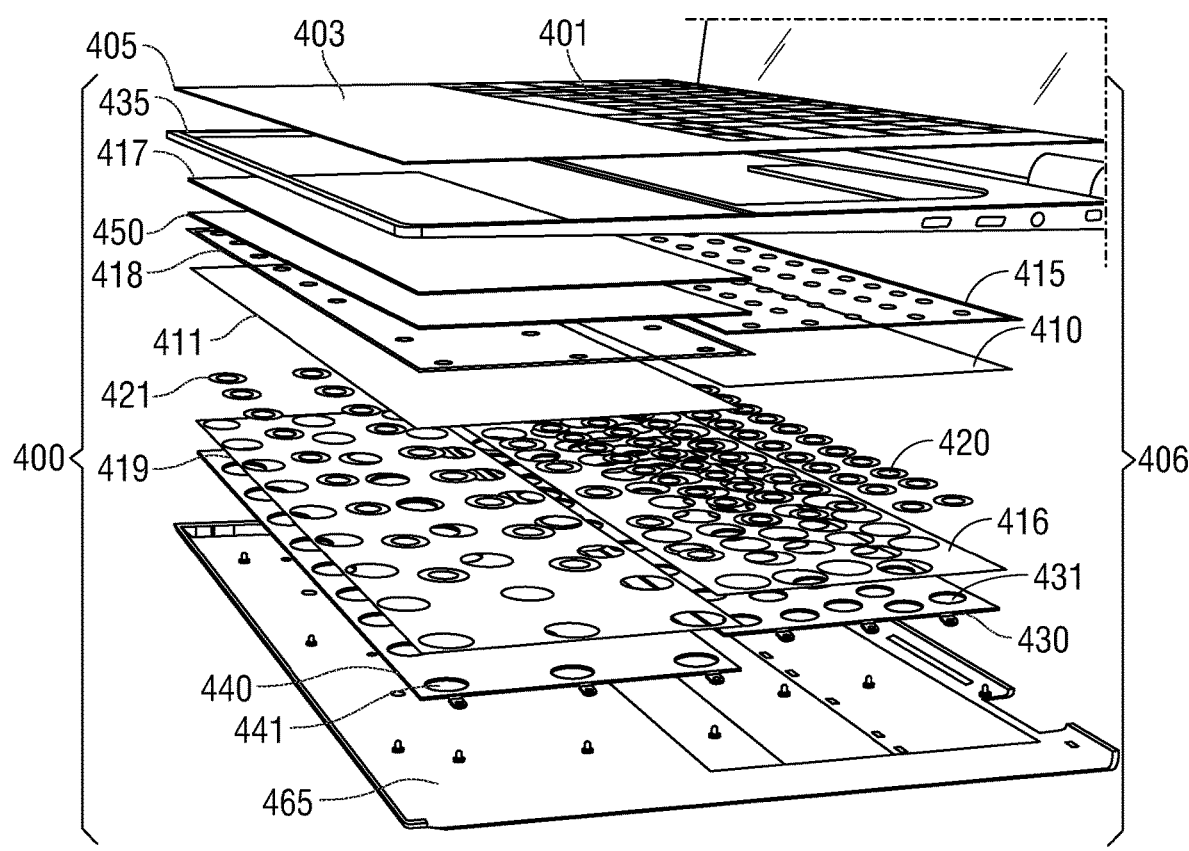
FIG. 4 is an exploded perspective view of a combination haptic keyboard, touchpad, and palm rest stack up according to an embodiment of the present disclosure.

FIG. 4 is an exploded perspective view of a combination haptic keyboard, touchpad, and palm rest stack up of an information handling system according to an embodiment of the present disclosure. The combination stack up includes a combined haptic touchpad and palm rest piezoelectric element based feedback assembly 400 and a haptic keyboard piezoelectric element based feedback assembly 406. A single coversheet 405 may be included within both assemblies 400 and 406 and may include a keyboard 401 and a combined palm rest and touchpad surface 403. Other embodiments may separate the palm rest and touchpad surface 403, such as described in greater detail with reference to FIG. 6. In one embodiment described with reference to FIG. 4, the entire surface of the combination touchpad and palm rest 403 may provide haptic force sensing and haptic feedback capabilities.

The keyboard 401 in an embodiment shows a plurality of keys, similar to those described in connection with FIG. 3A, arranged so as to receive input from a user at multiple keys. FIG. 4 also shows a top coversheet having both a keyboard 401 and a combination touchpad and palm rest 403. Either or both of the keyboard 401 and touchpad and palm rest 403 may be haptic systems as described in embodiments herein. In an embodiment, the keys may be arranged similar to a QWERTY design of a keyboard 401. However, other arrangements of any alphabetic, numeric, or symbolic keys is contemplated by the present description.

The combination stack up may include several layers similar to those described in connection with FIGS. 3A and 3B. In an embodiment, the combination stack up includes a coversheet layer 405 comprising the keyboard 401 and the combination touchpad and palm rest 403. In an embodiment, the combination touchpad and palm rest 403 and coversheet layer 405 may form a monolithic piece that, for example, includes different polycarbonate-acrylonitrile butadiene styrene (PC-ABS) resins used to cosmetically differentiate the touchpad 402 from a remaining portion of the coversheet layer 405. The different PC-ABS in such an embodiment may include chemical properties that differentiates the touchpad 402 portion to the coversheet layer 405 via other properties such as stiffness.

The coversheet layer 405 may be made of any type of elastically resilient material. Coversheet layer 405 may include a plurality of key designations, such as key pedestals as shown in keyboard 401 and a combination touchpad and palm rest 403 area designation. The elastically resilient material may allow, at least, a portion of the coversheet layer 405 to be deformed upon application of a pressure from a user's finger. Upon withdraw of the pressure from the user's finger, the material the coversheet layer 405 is made of allows the coversheet layer 405 of the key, the touchpad, or the palm rest to bend back to its pre-deformed form. In an embodiment, the resilient material may allow the coversheet layer 405 to travel a distance of between 0.01 mm and 2 mm. In some embodiments, coversheet layer 405 may be a single sheet material layer for the keyboard area designation 401, the touchpad area designation 402 and any palm rest area or bezel that covers the C-cover substructure.

In another embodiment, a top overlay (not shown, but discussed with respect to FIGS. 3A and 3B) may be used with the haptic combination touchpad and palm rest piezoelectric element based feedback assembly 406 described herein. A reusable adhesive or magnetic attachment may be used to adhere the top overlay to the coversheet 405. The adhered top overlay to the coversheet 405 may work with the coversheet to provide for actuation of the touchpad and palm rest piezoelectric elements 421 in accordance with the embodiment described herein describing direct interface with the coversheet 405 except that a user may interface with the top overlay layer adhered to the coversheet 405 and translating actuation through the coversheet 405 to the haptic combination touchpad and palm rest piezoelectric element based feedback assembly 406 layers within. In other embodiments, the top overlay may replace the coversheet 405 too, for a replaceable coversheet 405 which may be magnetically or adhered with reusable adhesive to the structure beneath. In such an embodiment, the replaceable coversheet 405 may be placed over the touchpad and palm rest piezoelectric elements 421 and the replaceable coversheet 405 may be used to actuate the touchpad and palm rest piezoelectric elements 421 as described below. In such an embodiment, a reusable adhesive may be used at 415 or no adhesive may be used with replaceable coversheet aligned and adhered magnetically or via a reusable adhesive not directly over the piezo electric element. In such embodiments, a protective membrane may be used of a hydrophobic material, such as a Gore® membrane for example over the piezoelectric element for protection during changes to the replaceable coversheet 405.

In an embodiment, the shape of the coversheet layer 405 or top overlay may be such so as to conform to the user's fingers. In an embodiment, in order to shape the coversheet layer 405, the material used to form the coversheet layer 405 may be subjected to an injection molding process. As such, a top portion of the coversheet layer 405 may be formed to be ergonomically beneficial to a user's actuation such as by providing a tactile key location designation and conforming to the user's fingers, for example. The injection molding process may be completed prior to the installation of the coversheet layer 405 into the remaining layers within the keyboard as described herein. Any number of processes may be included with the injection molding process. In an embodiment, the injection molding process used to form the coversheet layer 405 may include forming a number of holes within a sheet of, for example, ABS. These holes may correlate with each actuatable key to be formed on the keyboard 401. The formation of the coversheet layer 405 may continue with injection molding a translucent ABS through the holes to form a raised portion for key pedestals correlating with each of the number of keys on the keyboard 401. Opposite the raised portions a number of runners may be machined away to accommodate for receipt of other layers of the keyboard such as each of the keyboard piezoelectric elements 420. The surface of the coversheet layer 405 on which the raised portions of key pedestals are formed may be painted and any number or type of graphics may be laser etched on each raised portion indicating a specific key of the keyboard 401. As described, it is also contemplated that coversheet layer 405 may include a plurality of key vias for keys of the static keyboard of the present embodiments to be disposed through in some example embodiments. Similarly, it is contemplated that coversheet layer 405 may include a touchpad via as a window for a touchpad interface surface of a solid-state touchpad according to embodiments herein to be accessible in some aspects. Any combination of the above coversheet 405 layouts described is contemplated in embodiments described herein.

The combination stack up may further include a C-cover substructure 435 forming part of the base chassis with a cutout for keyboard 401 and combination touchpad and palm rest 403. In an embodiment, the coversheet layer 405 may be expanded to extend over an area where a user may rest the user's palms against the information handling system often referred to as a palm rest. In an embodiment, the coversheet layer 405 may be expanded over the area of the palm rest through a material such as a glass, or through a force sensing material, to create the combination touchpad and palm rest 403. In this embodiment, the glass or force sensing material may be attached to a remaining portion of the C-cover substructure 435 through a bonding process or via metal inserts attached to glass or force sensing material and connected to the C-cover substructure 435 through a number of fastening devices. In an embodiment, the C-cover substructure 435 may be made of a rigid material that allows little or no movement. The rigidity of the C-cover substructure 435 allows the other layers within the keyboard 401 and the combination touchpad and palm rest 403 to be maintained within the information handling system. In an embodiment, the C-cover substructure 435 may be made of a metal.

The combination stack up, in an embodiment, may further include any number of adhesive layers (e.g., 415, 416, 417, 418, and 419). In an embodiment, a first adhesive layer 415 disposed beneath the keyboard 401 portion of the coversheet 405 may mechanically couple the coversheet layer 405 to a keyboard contact foil layer 410. In another aspect of an embodiment, a second adhesive layer 417 disposed beneath the combination touchpad and palm rest area 403 portion of the coversheet 405 may mechanically couple the coversheet layer 405 to a capacitive touch layer 450. In an embodiment in which the C-cover 435 includes a cut out disposed across the combination touchpad and palm rest area 403 of the coversheet layer 405, a capacitive touch layer 450 may also provide structural support with a reinforcing material that may be otherwise provided by the C-cover 435 in embodiments in which the C-cover 435 is situated beneath the palm rest. The capacitive touch layer 450 in such an embodiment may comprise a structurally reinforcing material. In still another aspect of an embodiment, a third adhesive layer 418 disposed beneath the combination touchpad and palm rest area 403 portion of the coversheet 405 may mechanically couple the capacitive touch layer 450 to a combination touchpad and palm rest contact foil layer 411.

In other embodiments, the capacitive touch layer 450 may comprise also reinforcement member a made of a rigid material such as a glass, biaxially-oriented polyethylene terephthalate (BoPET) such as Mylar® produced by DUPONT®, a glass-reinforced epoxy such as FR4, or metal. Such a capacitive touch layer 450, which may be explained in greater detail with respect to FIG. 6, may include a grid of drive and sense lines to determine x- and y-touch locations on the combination touchpad and palm rest area 403 by a user.

The first, second, and third adhesive layers 415, 417, and 418 may include the placement of the adhesive at locations that may enhance the movement and prevent the hindrance of the actuation of the coversheet layer 405. In a specific embodiment, the first adhesive layer 415 may include placing the adhesive along borders of each of the keys as well as placing the adhesive at a central location of each of the keys. In another embodiment, the second adhesive layer 417 may include placing the adhesive uniformly across the surface of the reinforcement member 450. In still another embodiment, the third adhesive layer 417 may include placing the adhesive in locations correlating to locations of touchpad and palm rest piezoelectric elements 421 situated beneath the combination touchpad and palm rest contact foil 411.

The keyboard contact foil layer 410 and the combination touchpad and palm contact foil layer 411 may be made of any elastically resilient material that, when any given keyboard piezoelectric element 420 or touchpad and palm rest piezoelectric element 421 is actuated or the contact foil layers 410 or 411 are bent towards a lower portion of the respective assemblies, returns to its original state when the respective piezoelectric element 420 or 421 is no longer being actuated. The keyboard contact foil layer 410 may include a number of metal traces formed thereon that electrically and communicatively couples each of the keys and a corresponding keyboard piezoelectric element 420 to a keyboard controller of an information handling system that includes a haptic feedback keyboard control system such as described in connection with FIG. 1. In an embodiment, the keyboard controller may be a dedicated controller communicatively coupled to the keyboard contact foil layer 410 so as to detect keyboard piezo actuation signals from each of the keyboard piezoelectric elements 420 and provide keyboard haptic feedback control signals back to the respective keyboard piezoelectric elements 420. In an alternative embodiment, the keyboard controller may be a processor of the information handling system that, among other computations and execution of other computer readable program code, also executes computer readable program code associated with the haptic feedback keyboard control system as described in FIG. 1.

The combination touchpad and palm rest contact foil layer 411 may include a number of metal traces formed thereon that electrically and communicatively couples the combination touchpad and palm rest area 403 with a plurality of corresponding touchpad and palm rest piezoelectric elements 421 to a palm rest and touchpad controller of an information handling system that includes a haptic feedback keyboard and touchpad control system such as described in connection with FIG. 1. In an embodiment, the palm rest and touchpad controller may be a dedicated controller communicatively coupled to the combination touchpad and palm rest contact foil layer 411 so as to detect piezo actuation signals from each of the touchpad and palm rest piezoelectric elements 421 and provide touchpad haptic feedback control signals or palm rest touchpad haptic feedback control signals back to the respective touchpad and palm rest piezoelectric elements 421. In an alternative embodiment, the palm rest and touchpad controller may be a processor of the information handling system that, among other computations and execution of other computer readable program code, also executes computer readable program code associated with the haptic feedback keyboard and touchpad control system including an coversheet adaptation system to detect force levels for auxiliary haptic palm rest function activation as described in FIG. 1.

During operation of each key on the keyboard 401, the keyboard contact foil layer 410 may receive a keyboard piezo actuation signal from the respective keyboard piezoelectric elements 420 as they are compressed upon actuation at the metal traces that conduct the keyboard piezo actuation signal to the keyboard controller associated with the combination stack up. The metal traces formed on the keyboard contact foil layer 410 may further be used to conduct a return electrical keyboard haptic feedback control signal from the keyboard controller to the keyboard piezoelectric elements 420 so that the voltage and current of the keyboard haptic feedback control signal may cause the keyboard piezoelectric elements 420 to stretch or contract in response to a keyboard haptic feedback control signal and at varying polarities, voltages, or currents. This keyboard haptic feedback control signal to of each of the actuated keyboard piezoelectric elements 420 may cause a keyboard haptic feedback presented at each of the keys that the user may feel. This keyboard haptic feedback may be relayed to the user within microseconds of the user actuating any of the keys on the keyboard 401 such that the user physically detects a sensation that the key was pressed. This sensation felt by the user may be present despite no actual mechanical devices such as a scissor mechanism or other types of keyboard mechanical devices being present among the layers of the keyboard 401.

During operation of the combination touchpad and palm rest area 403, the combination touchpad and palm rest contact foil layer 411 may receive a touchpad and palm rest piezo actuation signal from the respective touchpad and palm rest piezoelectric elements 421 as they are compressed upon actuation at the metal traces that conduct the touchpad and palm rest piezo actuation signal to the palm rest and touchpad controller associated with the combination stack up. In another aspect, the combination touchpad and palm rest contact foil layer 411 may receive a touchpad and palm rest piezo actuation signal from one or more of the respective touchpad and palm rest piezoelectric elements 421 as a user rests palms upon the surface of the combination touchpad and palm rest 403. The metal traces formed on the combination touchpad and palm rest contact foil layer 411 may further be used to conduct a return electrical touchpad and palm rest haptic feedback control signal from the palm rest and touchpad controller to the touchpad and palm rest piezoelectric elements 421 so that the voltage and current of the touchpad and palm rest haptic feedback control signal may cause the touchpad and palm rest piezoelectric elements 421 to stretch or contract in response to a touchpad and palm rest haptic feedback control signal and at varying polarities, voltages, or currents. This touchpad and palm rest haptic feedback control signal to of each of the actuated touchpad and palm rest piezoelectric elements 421 may cause a touchpad and palm rest haptic feedback presented at various locations across the surface of the combination touchpad and palm rest area 403 that the user may feel depending on whether a threshold level of force is applied to the haptic palm rest including haptic touchpad at the actuation location. This touchpad and palm rest haptic feedback may be relayed to the user within microseconds of the user actuating any portion of the combination touchpad and palm rest area 403 such that the user physically detects a sensation that the touchpad was clicked or pressed down intentionally or in response to an auxiliary haptic palm rest function activation.

Unlike the individual keys of described in connection with the haptic keyboard of FIG. 3A, the individual touchpad and palm rest piezoelectric elements 421 may cooperate within the array to create this touchpad and palm rest haptic feedback felt by the user at the combined touchpad and palm rest area 403. In some specific embodiments, the location of actuation by the user may be detected by the capacitive touch layer (either integrated into the combination touchpad and palm rest contact foil layer 411, a separate capacitive touch layer 450, or with the reinforcement layer) to indicate to the palm rest and touchpad controller which touchpad and palm rest piezoelectric elements 421 should receive a touchpad and palm rest haptic feedback control signal. Along with the receipt of a touchpad and palm rest piezo actuation signal from the touchpad and palm rest piezoelectric elements 421, the palm rest and touchpad controller may cause all or a portion of the combined touchpad and palm rest area 403 forming the coversheet layer 405 to receive touchpad and palm rest haptic feedback. This may allow the touchpad and palm rest haptic feedback to be felt by the user across the entire surface of the combined touchpad and palm rest area 403 of the coversheet layer 405, across a left side of the combined touchpad and palm rest area 403, across a right side of the combined touchpad and palm rest area 403, across a top portion (e.g., closer to the display chassis 450) of the combined touchpad and palm rest area 403, across a bottom portion (e.g., further from the display chassis 450) of the combined touchpad and palm rest area 403, or any specific area across the surface of the combined touchpad and palm rest area 403. In some embodiments, only a touchpad and palm rest piezoelectric element 421 directly under the touch location or only touchpad and palm rest piezoelectric elements 421 next to the nearest touchpad and palm rest piezoelectric element 421 under the touch location may provide a touchpad and palm rest haptic feedback event. The capacitive touch layer 450 ma distinguish activation of the haptic touchpad portion of the combination haptic palm rest and touchpad area 403 from areas that are not designated as the haptic touchpad in other embodiments. In this way, the designated haptic touchpad area portion of the combination haptic palm rest and touchpad area 403 may be actuated as a touchpad separately from the other portions of the combination haptic palm rest and touchpad area 403. Along with the capacitive touch layer, the touchpad and palm rest piezoelectric elements 421 may allow a user to have the user's touch be detected at the combined touchpad and palm rest area 403 while actuation, at any location across the surface of the combined touchpad and palm rest area 403 provides touchpad and palm rest haptic feedback to the user so that the user can engage in a "click" action at the combined touchpad and palm rest area 403 such as when selecting an item on a graphical user interface.

The combination stack up may further include a fourth adhesive layer 416 that mechanically couples the keyboard contact foil layer 410 to a keyboard support plate 430, and a fifth adhesive layer 419 that mechanically couples the combination touchpad and palm rest contact foil layer 411 to a combination touchpad and palm rest support plate 440. In an embodiment, the fourth adhesive layer 416 may include the placement of an adhesive along borders of each keyboard piezoelectric element 420, and the fifth adhesive layer 419 may include the placement of an adhesive along borders of each touchpad and palm rest piezoelectric element 421 of the combination stack up. As shown in FIG. 4, the fourth adhesive layer 416 includes circular voids that conform to a shape of each keyboard piezoelectric element 420, and the fifth adhesive layer 419 includes circular voids that conform to a shape of each touchpad and palm rest piezoelectric element 421 within the combination stack up.

The support plates 430 and 440 may be made of rigid material such as a metal. The support plates 430 and 440 prevents deformation of the combination stack up except for, in some embodiments, the keyboard contact foil layer 410, the combination touchpad and palm rest contact foil layer 411, keyboard piezoelectric elements 420, touchpad and palm rest piezoelectric elements 421, first adhesive layer 415, second adhesive layer 417, third adhesive layer 418, fourth adhesive layer 416, and fifth adhesive layer 419 as for operation of the haptic keys. As such, the keyboard contact foil layer 410 may be allowed to detect the deformation of the keyboard piezoelectric elements 420, and the combination touchpad and palm rest contact foil layer 411 may be allowed to detect the deformation of the touchpad and palm rest piezoelectric elements 421. Additionally, a user using the keyboard 401, and combination touchpad and palm rest area 403 may feel a level of rigidity in the keyboard 401 and the combination touchpad and palm rest area 403 except that at the locations where the user has expected that some level of deformation occurs when pressure is applied to provide for key or touchpad actuation of the piezoelectric elements 420 and 421.

In an embodiment, the support plate 430 may include a number of cavities 431, and the support plate 440 may include a number of cavities 441 formed therein. The cavities 431 may be sized to have a relatively smaller diameter than the diameter of each of the respective keyboard piezoelectric elements 420. The cavities 441 may be sized to have a relatively smaller diameter than the diameter of each of the respective touchpad and palm rest piezoelectric elements 421. By including these cavities 431 and 441, the keyboard piezoelectric elements 420 and touchpad and palm rest piezoelectric elements 421 may be allowed to be deformed into the cavities 431 and 441 so that the deformation of the piezoelectric element 420 and touchpad and palm rest piezoelectric elements 421 creates the piezo actuation signals described herein (e.g., keyboard piezo actuation signal and touchpad piezo actuation signal). The metal plate of the keyboard piezoelectric elements 420 may have a diameter greater than cavities 431. The metal plate of the piezoelectric elements 421 may have a diameter greater than cavities 441. Upon compression or contraction of the piezoelectric material portions, such as a ceramic disk of the keyboard piezoelectric element 420 or touchpad and palm rest piezoelectric element 421, the metal plate may warp into or away from the cavity 431 or 441, respectively. The depth of the cavities 431 and 441 may also be selected to allow for at least a central portion of each piezoelectric element 420 or 421, respectively, to be deflected into the cavities 431 and 441 some distance. This distance of deflection, in an embodiment, may be 0.1 mm or smaller or may be greater. In an embodiment, the cavities 431 or 441 may also be holes punched or machined through the support plate 430 or 440.

In an embodiment, the support plates 430 and 440 may be secured to other rigid elements of the information handling system. In an embodiment, the support plates 430 and 440 may be secured to the C-cover substrate 435 via a number of bolts, screws, or other mechanical or chemical coupling device. In some embodiments, the support plates 430 and 440 may be operatively coupled to the D-cover 465 of the information handling system.

Each of the keyboard piezoelectric elements 420 and touchpad and palm rest piezoelectric elements 421 may include a first portion layer of piezoelectric material and a second portion conductive layer as described herein in connection with the larger figures describing the keys in FIGS. 3A, and 3B. Additionally, each keyboard piezoelectric element 420 of the keyboard 401 may be operatively coupled to at least one metal trace formed on the keyboard contact foil layer 410, and each touchpad and palm rest piezoelectric element 421 of the combination touchpad and palm rest 403 may be operatively coupled to at least one metal trace formed on the combination touchpad and palm rest contact foil layer 411 via a contact point such as a solder point. In this embodiment, the conductive layer associated with each of the piezoelectric materials of the keyboard piezoelectric elements 420 and touchpad and palm rest piezoelectric elements 421 may be operatively coupled to at least one metal trace formed on the contact foil layers 410 and 411 via a contact point such as a solder point. One or both of the contact foil layers 410 and 411 may, in a particular embodiment, include two metal traces for each keyboard piezoelectric element 420 or touchpad and palm rest piezoelectric element 421 at a first portion and a second portion.

During operation of the keyboard 401, a user may actuate a key formed on the coversheet layer 405 of the keyboard 401 by pressing down on that key. As a result of the mechanical stress placed on the piezoelectric material of the keyboard piezoelectric element 420 associated with the actuated key, an electric charge (e.g., keyboard piezo actuation signal) is created at the keyboard piezoelectric element 420. The keyboard piezo actuation signal is carried to one or more metal traces coupled to the piezoelectric material and the metal plate of the keyboard piezoelectric element 420 via a contact point such as a solder point. The electric charge received at the one or more metal traces may be conducted to a keyboard controller by the metal trace as described herein.

In this embodiment, the keyboard controller may detect that keyboard piezo actuation signal produced by the mechanical stress of the piezoelectric material of the keyboard piezoelectric element 420 and send an electrical signal (e.g., keyboard haptic feedback control signal) back to the piezoelectric material of the keyboard piezoelectric element 420. This keyboard haptic feedback control signal may have a certain voltage, current, and polarity (−, +) sufficient to render the piezoelectric material of the keyboard piezoelectric element 420 to cause a keyboard haptic feedback or sound. The keyboard haptic feedback control signal from the keyboard controller may follow the same or a different metal trace back to the keyboard piezoelectric element 420. The keyboard haptic feedback control signal may be received at the piezoelectric material and metal plate of the keyboard piezoelectric element 420 via, for example, a contact point such as a solder point. Because the piezoelectric material of the keyboard piezoelectric element 420 receives the keyboard haptic feedback control signal from the keyboard controller, this causes the piezoelectric material to be generate a keyboard haptic feedback. A keyboard haptic feedback control signal may be a sine wave, a square wave, a pulsed signal, or other waveform of changing current, voltage, or polarity applied to the keyboard piezoelectric element 420. As a result of the piezoelectric material stretching or contracting during the keyboard haptic feedback, the keyboard piezoelectric element 420 may warp downward or upward with respect to the cavity 431 and may return back to a non-deformed state, thereby creating keyboard haptic feedback felt by the user's finger. In an embodiment, the relay of the keyboard piezo actuation signal to the keyboard controller, the detection of the keyboard controller of the keyboard piezo actuation signal, and the return of the keyboard haptic feedback control signal by the keyboard controller to the keyboard piezoelectric element 420 may be sufficiently quick enough for the user to feel the keyboard haptic feedback in a manner that the user does not detect any temporal delay between the actuation of the key and the detection of the keyboard haptic feedback created at the keyboard piezoelectric element 420. In an embodiment, the relay of the keyboard piezo actuation signal to the keyboard controller, the detection of the keyboard controller of the keyboard piezo actuation signal, and the return of the keyboard haptic feedback control signal by the keyboard controller to the keyboard piezoelectric element 420 may be on the order of microseconds. This operation of each of the keys of the keyboard 401 may be conducted every time the user actuates any key on the keyboard 401.

During operation of the combination touchpad and palm rest 403, a user may actuate a touchpad functionality by pressing down on any portion of the combination touchpad and palm rest area 403 with a finger, in an intentional clicking motion. Similarly, a user may actuate a palm rest functionality by pressing down on any portion of the combination touchpad and palm rest area 403 with any actuation device such as a stylus. As a result of the mechanical stress placed on the piezoelectric material of the touchpad and palm rest piezoelectric element 421 associated with the touchpad and palm rest region, an electric charge (e.g., touchpad and palm rest piezo actuation signal) is created at the touchpad and palm rest piezoelectric element 421. The touchpad and palm rest piezo actuation signal is carried to one or more metal traces coupled to the piezoelectric material and the metal plate of the touchpad and palm rest piezoelectric element 421 via a contact point such as a solder point. The touchpad and palm rest piezo actuation signal received at the one or more metal traces may be conducted to a palm rest and touchpad controller by the metal trace as described herein. The palm rest and touchpad controller in an embodiment may differentiate between a touchpad piezo actuation signal associated with an intentional activation of the touchpad, and a palm rest piezo actuation signal associated with the user resting palms upon the palm rest, with no intention to activate the touchpad functionality thereby depending on the threshold levels of applied force. The palm rest and touchpad controller in such an embodiment may isolate touchpad actuation signals from all received touchpad and palm rest piezo actuation signals in such a way, and may respond to only touchpad actuation signals with a touchpad haptic feedback control signal. At or above a force threshold level, the haptic palm rest and touchpad controller ma activate auxiliary haptic palm rest functions at the haptic palm rest or even across the designated haptic touchpad interface portion of the haptic palm rest area 403.

In these embodiments, the palm rest and touchpad controller may detect that touchpad piezo actuation signal produced by the mechanical stress of the piezoelectric material of the touchpad and palm rest piezoelectric element 421 deformed during an intentional click of the touchpad and send a touchpad haptic feedback control signal back to the piezoelectric material of the touchpad and palm rest piezoelectric element 421. This touchpad haptic feedback control signal may have a certain voltage, current, and polarity (−, +) sufficient to render the piezoelectric material of the touchpad and palm rest piezoelectric element 421 to cause a haptic feedback or sound. The touchpad haptic feedback control signal from the palm rest and touchpad controller may follow the same or a different metal trace as the one through which the touchpad piezo actuation signal was received back to the touchpad and palm rest piezoelectric element 421. The touchpad haptic feedback control signal may be received at the piezoelectric material and metal plate of the touchpad and palm rest piezoelectric element 421 via, for example, a contact point such as a solder point. Because the piezoelectric material of the touchpad and palm rest piezoelectric element 421 receives the touchpad haptic feedback control signal from the palm rest and touchpad controller, this causes the piezoelectric material to generate a touchpad haptic feedback. A touchpad haptic feedback control signal may be a sine wave, a square wave, a pulsed signal, or other waveform of changing current, voltage, or polarity applied to the piezoelectric element 421. As a result of the piezoelectric material stretching or contracting during the haptic feedback, the touchpad and palm rest piezoelectric element 421 may warp downward or upward with respect to the cavity 441 and may return back to a non-deformed state, thereby creating haptic feedback felt by the user. In an embodiment, the relay of the touchpad piezo actuation signal to the palm rest and touchpad controller, the detection of the palm rest and touchpad controller of the piezo actuation signal, and the return of the touchpad haptic feedback control signal by the palm rest and touchpad controller to the piezoelectric element 421 may be sufficiently quick enough for the user to feel the haptic feedback in a manner that the user does not detect any temporal delay between the actuation of the touchpad and the detection of the touchpad haptic feedback created at the touchpad and palm rest piezoelectric element 421. In an embodiment, the relay of the touchpad and palm rest piezo actuation signal to the palm rest and touchpad controller, the detection of the palm rest and touchpad controller of the touchpad and palm rest actuation signal, the determination by the palm rest and touchpad controller that the touchpad and palm rest piezo actuation signal is a touchpad actuation signal, and the return of the touchpad haptic feedback control signal by the palm rest and touchpad controller to the touchpad and palm rest piezoelectric element 421 may be on the order of microseconds.

In these embodiments, the palm rest and touchpad controller may detect that haptic palm rest actuation has exceeded a force threshold and a haptic palm rest piezo actuation is produced by the mechanical stress of the piezoelectric material of the touchpad and palm rest piezoelectric element 421 deformed during an intentional actuation pressure applied to any portion of the combination haptic palm rest and touchpad area and send a palm rest and touchpad haptic feedback control signal back to the piezoelectric material of the touchpad and palm rest piezoelectric element 421. This touchpad haptic feedback control signal may have a certain voltage, current, and polarity (−, +) sufficient to render the piezoelectric material of the touchpad and palm rest piezoelectric element 421 to cause a haptic feedback or sound. The touchpad haptic feedback control signal from the palm rest and touchpad controller may follow the same or a different metal trace as the one through which the touchpad piezo actuation signal was received back to the touchpad and palm rest piezoelectric element 421. The touchpad haptic feedback control signal may be received at the piezoelectric material and metal plate of the touchpad and palm rest piezoelectric element 421 via, for example, a contact point such as a solder point. Because the piezoelectric material of the touchpad and palm rest piezoelectric element 421 receives the touchpad and palm rest haptic feedback control signal from the palm rest and touchpad controller, this causes the piezoelectric material to generate a palm rest haptic feedback for an auxiliary haptic palm rest function. A touchpad and palm rest haptic feedback control signal may be a sine wave, a square wave, a pulsed signal, or other waveform of changing current, voltage, or polarity applied to the piezoelectric element 421. As a result of the piezoelectric material stretching or contracting during the haptic feedback, the touchpad and palm rest piezoelectric element 421 may warp downward or upward with respect to the cavity 441 and may return back to a non-deformed state, thereby creating haptic feedback felt by the user. In an embodiment, the relay of the haptic palm rest piezo actuation signal to the palm rest and touchpad controller, the detection of the palm rest and touchpad controller of the piezo actuation signal, and the return of the touchpad and palm rest haptic feedback control signal by the palm rest and touchpad controller to the piezoelectric element 421 may be sufficiently quick enough for the user to feel the haptic feedback in a manner that the user does not detect any temporal delay between the actuation of the haptic palm rest and touchpad area and the detection of the palm rest haptic feedback created at the touchpad and palm rest piezoelectric element 421. In an embodiment, the relay of the touchpad and palm rest piezo actuation signal to the palm rest and touchpad controller, the detection of the palm rest and touchpad controller of the touchpad and palm rest actuation signal, the determination by the palm rest and touchpad controller that the touchpad and palm rest piezo actuation signal is a touchpad actuation signal, and the return of the palm rest and touchpad haptic feedback control signal by the palm rest and touchpad controller to the touchpad and palm rest piezoelectric element 421 may be on the order of microseconds. The above operations of the combination touchpad and palm rest area 403 may be conducted every time the user actuates any portion of the combination touchpad and palm rest area 403.

Figure 5:
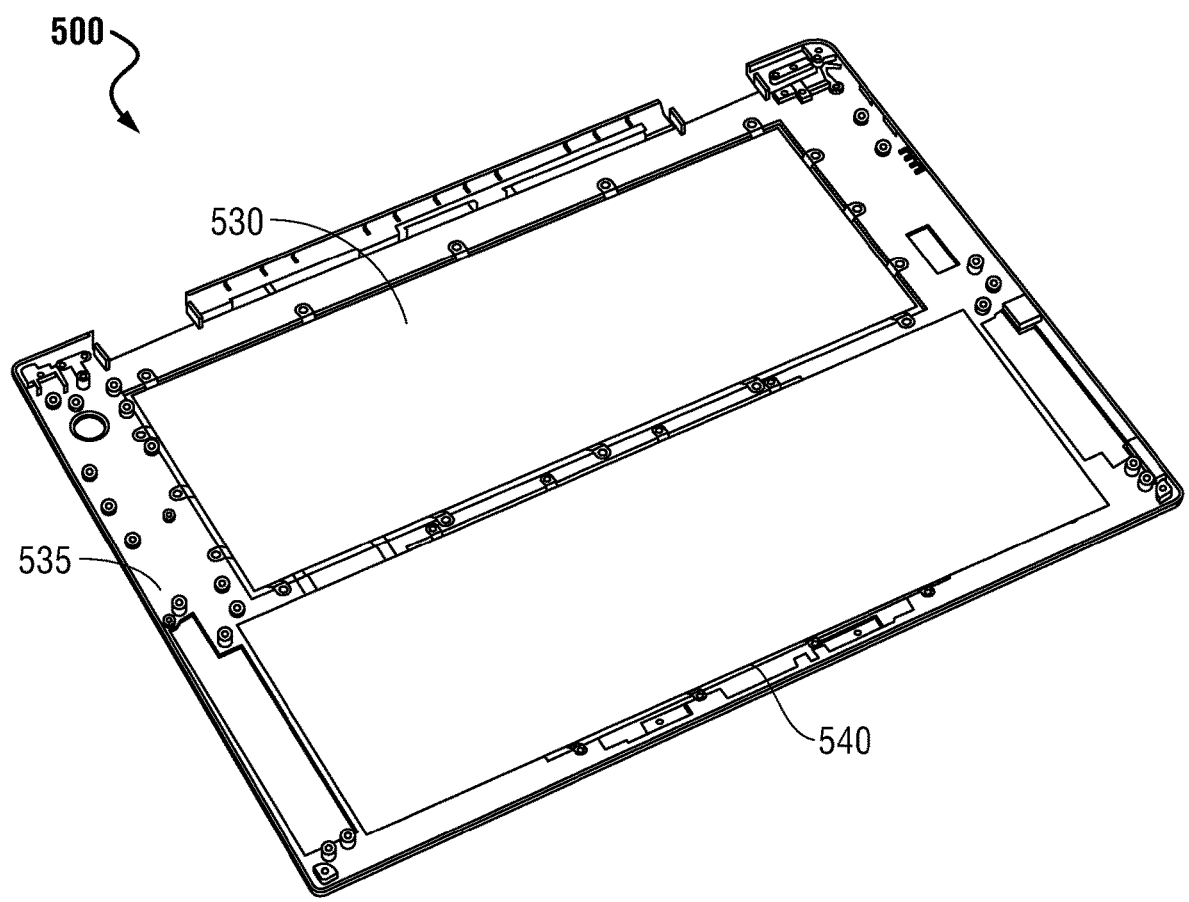
FIG. 5 is back perspective view of a C-cover for a combination touchpad and palm rest haptic stack up according to an embodiment of the present disclosure.

FIG. 5 is back perspective view of a C-cover 535 for a combination touchpad and palm rest haptic stack up of an information handling system 500 according to an embodiment of the present disclosure. The C-cover 535 may be used to house a keyboard and combination touchpad and palm rest as described herein. As also described, each of the keyboard and combination touchpad and palm rest may include a support plate 530 and 540, respectively. In an embodiment, a single support plate may be used to support one or more of the keyboard piezoelectric assemblies described in connection with FIGS. 3A and 3B. In an alternative embodiment, the keyboard piezoelectric assemblies and the combination touchpad and palm rest piezoelectric assembly may each include their own support plate 530 and 540, respectively. The support plates of the C-cover 535 shown may increase the stiffness of the haptic keyboard and combination touchpad and palm rest described herein because the support plates 530 and 540 may be firmly fixed to the C-cover 535. This may enhance the perceived quality of the information handling system while still having a haptic feedback method and system that allows the user to feel as if an actuation of a key or touchpad has occurred. Still further, the haptic feedback systems described herein creates a keyboard and touchpad that feels like a mechanical keyboard or combination touchpad and palm rest and vastly reduces physical key travel. Additionally, the construction of the haptic feedback systems described herein results in a much thinner and simpler keyboard and touchpad than that of a mechanical keyboard or touchpad enabling a thinner information handling system in some embodiments. With the reduction in space occupied by the haptic feedback keyboard and combination touchpad and palm rest, space within the information handling system base chassis may be increased for use by other, additional, or larger components within the information handling system. In a specific example embodiment, the additional space provided within the information handling system due to the use of a haptic feedback keyboard and combination touchpad and palm rest results in the ability to increase the size of a battery used to power the information handling system.

As shown in FIG. 5, the C-cover 535 may include both a piezoelectric keyboard portion secured to the C-cover 535 by a first support plate 530 and a combination touchpad and palm rest portion being secured to the C-cover 535 by a second support plate 540. In an embodiment, it is contemplated that the combination touchpad and palm rest and keyboard as described herein may be secured to the C-cover 535 by a single support plate that combines 530 and 540.

Figure 6:
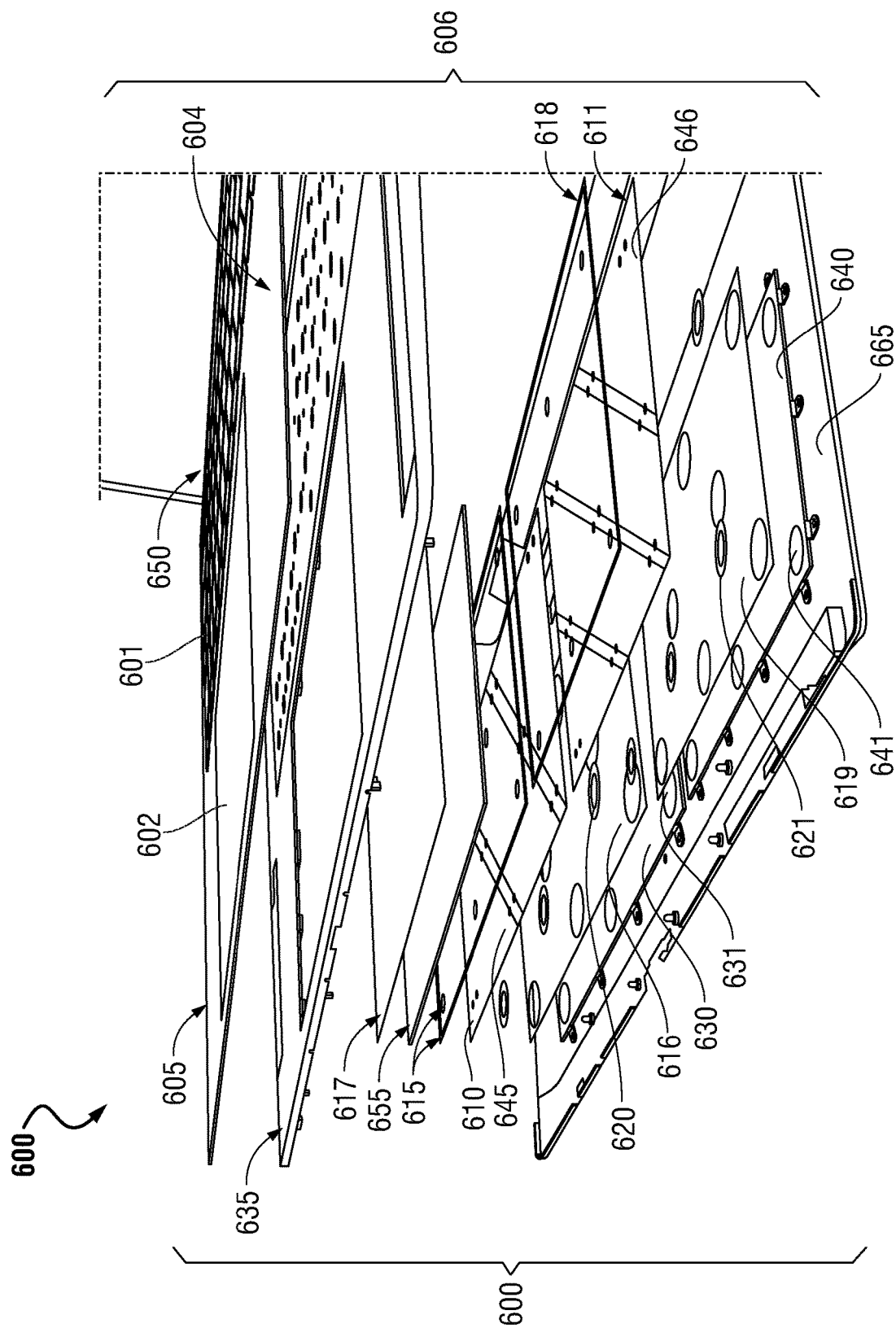
FIG. 6 is an exploded perspective view of a combination touchpad and palm rest stack up according to another embodiment of the present disclosure.

FIG. 6 is an exploded perspective view of a combination touchpad and haptic palm rest stack up of an information handling system according to another embodiment of the present disclosure. As described herein, the combination touchpad and haptic palm rest stack up includes a haptic touchpad rest piezoelectric element based feedback assembly 600 and a haptic palm rest piezoelectric element based feedback assembly 606. A single coversheet 605 may be included within both assemblies 600 and 606 and may include a haptic touchpad interface area 602 that implements the piezoelectric elements 620 and a haptic palm rest portion 604 that implements the piezoelectric elements 621 described herein. The touchpad may be formed, in some embodiments, into a haptic touchpad interface area 602 in coversheet layer 605. In other embodiments, such as described with respect to FIG. 4, the coversheet layer 605 may incorporate a combination touchpad and haptic palm rest cover area 403. It is specifically contemplated that embodiments of the present disclosure may combine the capacitive touch layer 655 and capability described herein with respect to FIG. 6 with the combination touchpad and haptic palm rest cover area 403 of FIG. 4, to form a capacitive touch sensitive combination touchpad and haptic palm rest cover area that also provides force sensing and haptic feedback capabilities via the piezoelectric elements and controllers operably connected thereto.

Coversheet 605 may also have a number of keys of a keyboard 601. The coversheet 605 may also have no keys in an optional embodiment but may be flat and have magnets, ferromagnetic inserts, or Hall effect sensors for use with a top overlay (not shown) attachable to the coversheet 605. In yet other optional embodiments, the coversheet 605 may have a set of keys for a default keyboard such as a QWERTY-type keyboard and also have magnets, ferromagnetic inserts, or Hall effect sensors for use with the top overlays. The optional top overlay may be fittingly attached magnetically or via reusable adhesive to tightly nest into the default keyboard layout of keys in the existing coversheet 605 in such embodiments.

Coversheet 605 may be made of a single sheet material for keyboard 601, and haptic palm rest areas 604 located to either the left or right side of the haptic touchpad interface area 602 from the perspective of the user in embodiments as described herein. The haptic touchpad interface area 602 in such an embodiment may appear through a via in the C-cover 635. In some example embodiments, the haptic keyboard 601 may have key vias in the C-cover 635. In other example embodiments, a mechanical keyboard 601 may be implemented with a haptic touchpad interface area 602 or vice versa. In still other example embodiments, a mechanical keyboard 601 may be implemented with a haptic combination touchpad and palm rest.

The coversheet layer 605 with designated haptic touchpad interface area 602 and haptic palm rest area 604 may be made of any type of elastically resilient material. The elastically resilient material may allow, at least, a portion of the touchpad coversheet layer 605 to be deformed upon application of a pressure from a user's finger. Upon withdraw of the pressure from the user's finger, the material of the touchpad coversheet layer 605 is made of allows the touchpad coversheet layer 605 of the touchpad to bend back to its pre-deformed state. In an embodiment, the resilient material may allow the touchpad coversheet layer 605 at haptic touchpad interface area 602 to travel a distance of between 0.01 mm and 2 mm.

In the embodiment shown in FIG. 6, touchpad piezoelectric elements 620 are placed in an array under the haptic touchpad interface area 602 of the coversheet layer 605. The placement of the touchpad piezoelectric elements 620 in the array under the haptic touchpad interface area 602 of the coversheet layer 605 may include more or less than the number of touchpad piezoelectric elements 620 shown. As described herein, the operation of the touchpad may be dependent on the location and number of touchpad piezoelectric elements 620. During operation, a haptic palm rest and touchpad controller (not shown) similar to the haptic palm rest and touchpad controller described in connection with FIG. 4 may receive an electric charge (e.g., touchpad piezo actuation signal) from one or a plurality of touchpad piezoelectric elements 620 formed below and across the haptic touchpad interface area 602 of coversheet layer 605 so that the haptic palm rest and touchpad controller may detect one or more touchpad piezoelectric elements 620 providing a touchpad piezo actuation signal depending on proximity underneath an x- and y-coordinate location of the actuation location on the haptic touchpad interface area 602 by the user. The receipt of one or a plurality of touchpad piezo actuation signals from these touchpad piezoelectric elements 620 may allow the haptic palm rest and touchpad controller to appropriately send a touchpad haptic feedback control signal to any of the touchpad piezoelectric elements 620 so that the user may detect a touchpad haptic feedback at the location where the user has actuated the haptic touchpad interface area 602 of the coversheet layer 605.

Haptic palm rest piezoelectric elements 621 may be placed in an array under the haptic palm rest 604 of the coversheet layer 605. The placement of the haptic palm rest piezoelectric elements 621 in the array under the haptic palm rest of the coversheet layer 605 may include more or less than the number of haptic palm rest piezoelectric elements 621 shown. As described herein, the operation of the haptic palm rest may be dependent on the location and number of haptic palm rest piezoelectric elements 621. During operation, a haptic palm rest and touchpad controller (not shown) similar to the haptic palm rest and touchpad controller described in connection with FIG. 4 may send a haptic palm rest haptic feedback control signal to any of the haptic palm rest piezoelectric elements 621 so that the user may detect a haptic palm rest haptic feedback at one or more locations across the haptic palm rest 604 of the coversheet layer 605. Such a haptic palm rest haptic feedback control signal may be transmitted by the palm controller in an embodiment in response to a code instruction from a processor of the information handling system, rather than in response to any actuation of the haptic palm rest 604. For example, notifications, alarms, tones, or haptic tactile feedback control signal or audio signals received according to software applications running on the information handling system may prompt such a haptic palm rest haptic feedback control signal. In response, one or more of the haptic palm rest piezoelectric elements 621 may provide a tactile haptic feedback to alert the user to a notification or alarm, or to play a received haptic tactile feedback control signal or audio signal, for example.

The coversheet 605 with haptic touchpad interface area 602 may further include a C-cover substructure 635. The C-cover substructure 635 may be made of a rigid material that allows little or no movement. The rigidity of the C-cover substructure 635 allows the other layers within the assemblies 600 and 604 to be maintained within the information handling system. In an embodiment, the C-cover substructure 635 may be made of a metal.

The assemblies 600 and 604, in an embodiment, may further include any number of adhesive layers 615, 616, 617, 618, and 619. In an embodiment, a first adhesive layer 617 may mechanically couple the touchpad coversheet layer 605 to a capacitive touch layer 655 disposed beneath the haptic touchpad interface area 602. The capacitive touch layer 655 may be made of a rigid material such as a glass, biaxially-oriented polyethylene terephthalate (BoPET) such as Mylar® produced by DUPONT®, or a glass-reinforced epoxy such as FR4 to serve a purpose as a stiffening layer as well. The capacitive touch layer 655 includes a grid of drive and sense lines to determine x- and y-touch locations on haptic touchpad interface area 602 by a user. The capacitive touch layer 655 may be placed within the layers of the touchpad to distribute forces from a user's finger across the surface of the haptic touchpad interface area 602 and to the nearest or a plurality of nearest touchpad piezoelectric elements 620 in the array formed below and across the bottom surface of the haptic touchpad interface area 602 of the coversheet layer 605 and capacitive touch layer 655. The stiffening function of the capacitive touch stiffening layer 655 is an optional embodiment as a rigidity of the haptic touchpad interface area 602 may be provided by other layers as well in other embodiments.

A second adhesive layer 615 may attach the capacitive touch layer 655 to the touchpad contact foil layer 610, and may include the placement of the adhesive at locations that may enhance the movement and prevent the hindrance of the actuation of the coversheet layer 605 at those locations across the haptic touchpad interface area 602 where touchpad piezoelectric elements 620 are present. In a specific embodiment, the second adhesive layer 615 may include placing the adhesive along borders of each of the touchpad piezoelectric elements 620 as well as placing the adhesive at a central location of each of the touchpad piezoelectric elements 620.

In an embodiment, the capacitive touch layer 655 may include a capacitive touch layer x and y grid that detects and measures anything that is conductive such as a user's finger. The drive lines and sense lines may be a grid of indium tin oxide (ITO) or other conductive materials arranged to detect capacitive changes at x and y locations across the capacitive touch layer that correspond to the touch interface cover layer of the haptic touchpad interface area 602. The capacitive touch layer 655 may be a printed circuit board (PCB) layer for the detection of the user's finger at an x- and y-coordinate location across the surface of the area of the haptic touchpad interface area 602 of the coversheet layer 605. The capacitive touch layer 655 may be an array of drive lines and sense lines of ITO formed on the capacitive touch stiffening layer 655 or on the touchpad contact foil 610 in an embodiment. Drive lines and sense lines may be operatively coupled to a capacitive touch controller for determining x- and y-location of touches on the haptic touchpad interface area 602. The capacitive touch layer can be part of the touchpad contact foil layer 610, or its own contact touch layer 655, or part of a stiffener layer (e.g., as described with reference to FIG. 4) in various embodiments.

A third adhesive layer 618 may attach the portion of the cover sheet 605 including the haptic palm rest 604 to the haptic palm rest contact foil layer 611, and may include the placement of the adhesive at locations that may enhance the movement and prevent the hindrance of the actuation of the coversheet layer 605 at those locations across the haptic palm rest 604 where haptic palm rest piezoelectric elements 621 are present. In a specific embodiment, the third adhesive layer 618 may include placing the adhesive along borders of each of the haptic palm rest piezoelectric elements 621 as well as placing the adhesive at a central location of each of the haptic palm rest piezoelectric elements 621.

The touchpad contact foil layer 610 adhered to the capacitive touch layer 655 via the second adhesive layer 615 may be made of any elastically resilient material that, when any given location at the coversheet layer 605 is actuated or the touchpad contact foil layer 610 is bent towards a lower portion of the respective location, returns to its original state when the respective location is no longer being actuated. The haptic palm rest contact foil layer 611 adhered to the coversheet layer 605 via the third adhesive layer 618 may be made of any elastically resilient material that, when any given location at the coversheet layer 605 is actuated or the haptic palm rest contact foil layer 611 is bent towards a lower portion of the respective location, returns to its original state when the respective location is no longer being actuated.

The touchpad contact foil layer 610 may include a number of metal traces 645 formed thereon that electrically and communicatively couples each of the locations and corresponding piezoelectric elements 620 to a haptic palm rest and touchpad controller (not shown) of an information handling system that includes a haptic feedback keyboard and touchpad control system such as described in connection with FIG. 1. Traces may be opposite the capacitive touch layer 655 on touchpad contact foil layer 610 in an embodiment. In an embodiment, the haptic palm rest and touchpad controller may be a dedicated controller communicatively coupled to the touchpad contact foil layer 610 so as to detect touchpad piezo actuation signals from the touchpad piezoelectric elements 620 and provide touchpad haptic feedback control signals back to the respective touchpad piezoelectric elements 620. In an alternative embodiment, the haptic palm rest and touchpad controller may be a processor of the information handling system that, among other computations and execution of other computer readable program code, also executes computer readable program code associated with the haptic feedback keyboard and touchpad control system as described in FIG. 1.

The haptic palm rest contact foil layer 611 may include a number of metal traces 646 formed thereon that electrically and communicatively couples each of the locations and corresponding haptic palm rest piezoelectric elements 621 to a haptic palm rest and touchpad controller (not shown) of an information handling system that includes a haptic feedback keyboard and touchpad control system such as described in connection with FIG. 1. Traces may be opposite the cover sheet 605 on haptic palm rest contact foil layer 611 in an embodiment. In an embodiment, the haptic palm rest and touchpad controller may be a dedicated controller communicatively coupled to the haptic palm rest contact foil layer 611 so as to provide palm rest haptic feedback control signals to the respective haptic palm rest piezoelectric elements 621. In an alternative embodiment, the haptic palm rest and touchpad controller may be a processor of the information handling system that, among other computations and execution of other computer readable program code, also executes computer readable program code associated with the haptic feedback keyboard and touchpad control system as described in FIG. 1.

Each of the touchpad piezoelectric elements 620 and haptic palm rest piezoelectric elements 621 may include a layer of piezoelectric material and a conductive metal plate layer as described herein in connection with the larger figures describing the piezoelectric element in FIG. 3B. Additionally, each of the touchpad piezoelectric elements 620 and haptic palm rest piezoelectric elements 621 of the assembly 606 may be operatively coupled to at least one metal trace 645 or 646 formed on the touchpad contact foil layer 610, or the haptic palm rest contact foil layer 611, respectively, via a contact point such as a solder point. In this embodiment, the conductive metal plate and the piezoelectric materials of the touchpad piezoelectric elements 620 and haptic palm rest piezoelectric elements 621 may each be operatively coupled to at least one metal trace 645 or 646 formed on the touchpad contact foil layer 610 or the haptic palm rest contact foil layer 611, respectively, via a contact point such as a solder point. Thus, the touchpad contact foil layer 610 may, in an embodiment, include two metal traces 645 for each touchpad piezoelectric element 620, and the haptic palm rest contact foil layer 611 may include two metal traces 646 for each haptic palm rest piezoelectric element 621 formed in the assembly 606.

During operation of the haptic touchpad interface area 602, the touchpad contact foil layer 610 may receive a touchpad piezo actuation signal from one or a plurality of touchpad piezoelectric elements 620 operatively coupled underneath the metal traces 645 that conduct the touchpad piezo actuation signal to the haptic palm rest and touchpad controller associated with the haptic touchpad interface area 602. The metal traces 645 formed on the touchpad contact foil layer 610 may further be used to conduct a touchpad haptic feedback control signal from the haptic palm rest and touchpad controller to the touchpad piezoelectric elements 620 so that the voltage and current of the touchpad haptic feedback control signal may cause the touchpad piezoelectric elements 620 to stretch or contract in response to a touchpad haptic feedback control signal and at varying polarities, voltages, or currents. This touchpad haptic feedback control signal to of each of the actuated touchpad piezoelectric elements 620 may cause a touchpad haptic feedback presented at the touchpad actuation location that the user may feel. As described, the touchpad haptic feedback control signal may be a sine wave, a square wave, a pulsed signal or other variations of voltage or polarity changes to generate a warping of a metal plate for the touchpad haptic feedback event. This touchpad haptic feedback may be relayed to the user within microseconds of the user actuating a location on the touchpad area 602 of the coversheet layer 605 such that the user physically detects a sensation that the haptic touchpad interface area 602 was pressed. This sensation felt by the user may be present, despite no actual mechanical devices, such as a click switch mechanism, a touchpad trigger, or other types of touchpad mechanical devices being present among the layers of the assembly 600. The touchpad haptic feedback in particular may feel like a click similar to a mechanical switch click upon a press for selection by a user.

Unlike the individual keys of described in connection with the haptic keyboard of FIG. 3A, the individual touchpad piezoelectric elements 620 may cooperate within the array to create this touchpad haptic feedback felt by the user at the haptic touchpad interface area 602. In some specific embodiments, the location of actuation by the user may be detected by the capacitive touch layer (either integrated into the touchpad contact foil layer 610, a separate capacitive touch layer 655, or with a stiffening layer such as described with respect to FIG. 4) to indicate to the haptic palm rest and touchpad controller which touchpad piezoelectric elements 620 should receive a touchpad haptic feedback control signal. Along with the receipt of a touchpad piezo actuation signal from the touchpad piezoelectric elements 620, the haptic palm rest and touchpad controller may cause all or a portion of the haptic touchpad interface area 602 to receive touchpad haptic feedback. This may allow the touchpad haptic feedback to be felt by the user across the entire surface of the haptic touchpad interface area 602, across a left side of the haptic touchpad interface area 602, across a right side of the haptic touchpad interface area 602, across a top portion (e.g., closer to the display chassis 650) of the haptic touchpad interface area 602, across a bottom portion (e.g., further from the display chassis 650) of the haptic touchpad interface area 602, or any specific area across the surface of the haptic touchpad interface area 602. In some embodiments, only a touchpad piezoelectric element 620 directly under the touch location or only touchpad piezoelectric elements 620 next to the nearest touchpad piezoelectric element 620 under the touch location may provide a touchpad haptic feedback event. Along with the capacitive touch layer 655, the touchpad piezoelectric elements 620 may allow a user to have the user's touch be detected at the touchpad while actuation, at any location across the surface of the haptic touchpad interface area 604 provides touchpad haptic feedback to the user so that the user can engage in a "click" action at the touchpad such as when selecting an item on a graphical user interface.

During operation of the haptic palm rest 604, the haptic palm rest contact foil layer 611 may conduct a haptic palm rest haptic feedback control signal from the haptic palm rest and touchpad controller to the haptic palm rest piezoelectric elements 621 so that the voltage and current of the haptic palm rest haptic feedback control signal may cause the haptic palm rest piezoelectric elements 621 to stretch or contract in response to a palm rest haptic feedback control signal and at varying polarities, voltages, or currents. This palm rest haptic feedback control signal to of each of the actuated haptic palm rest piezoelectric elements 621 may cause a haptic palm rest haptic feedback presented at one or more locations across the haptic palm rest 604 that the user may feel. As described, the palm rest haptic feedback control signal may be a sine wave, a square wave, a pulsed signal or other variations of voltage or polarity changes to generate a warping of a metal plate for the palm rest haptic feedback event.

The assembly 600 may further include a fourth adhesive layer 616 that mechanically couples the touchpad contact foil layer 610 to a touchpad support plate 630. In an embodiment, the fourth adhesive layer 616 may include an adhesive that includes the placement of an adhesive along borders of each touchpad piezoelectric element 620. As shown in FIG. 6, the fourth adhesive layer 616 includes circular voids that conform to a shape of each touchpad piezoelectric element 620 placed below the haptic touchpad interface area 602.

The touchpad support plate 630 may be made of rigid material such as a metal. The touchpad support plate 630 prevents deformation of the assembly 600 except for, in some embodiments, actuation levels of deformation at the touchpad contact foil layer 610, touchpad piezoelectric elements 620, the first adhesive layer 617, the second adhesive layer 615, fourth adhesive layer 616, and other relevant layers as described. As such, the touchpad contact foil layer 610 may be allowed to detect the deformation of the touchpad piezoelectric elements 620. Additionally, a user using the assembly 600 may feel a level of rigidity in the area of the haptic touchpad interface area 602 that the user actuates with the touchpad piezoelectric elements 620 providing a touchpad haptic feedback to mimic the deformation to occur when pressure is applied.

In an embodiment, the touchpad support plate 630 may include a number of cavities 631 formed therein. The cavities 631 may be sized to have a relatively smaller diameter than the diameter of each of the respective touchpad piezoelectric elements 620. By including these cavities 631, the touchpad piezoelectric elements 620 may be allowed to deform into the cavities 631 so that the deformation of the touchpad piezoelectric elements 620 creates the touchpad piezo actuation signal described herein to detect actuation. The depth of the cavities 631 may also be selected to allow for at least a central portion of each touchpad piezoelectric elements 620 to be deflected into the cavities 631 some distance. This distance of deflection, in an embodiment, may be 0.1 mm or smaller or greater according to embodiments herein.

The assembly 606 may further include a fifth adhesive layer 619 that mechanically couples the haptic palm rest contact foil layer 611 to a haptic palm rest support plate 640. In an embodiment, the fifth adhesive layer 619 may include an adhesive that includes the placement of an adhesive along borders of each haptic palm rest piezoelectric element 621. As shown in FIG. 6, the fifth adhesive layer 619 includes circular voids that conform to a shape of each haptic palm rest piezoelectric element 621 placed below the haptic palm rest area 604.

The haptic palm rest support plate 640 may be made of rigid material such as a metal. The haptic palm rest support plate 640 prevents deformation of the assembly 606 except for, in some embodiments, actuation levels of deformation at the haptic palm rest contact foil layer 611, haptic palm rest piezoelectric elements 621, the third adhesive layer 618, fifth adhesive layer 619, and other relevant layers as described. As such, the haptic palm rest contact foil layer 611 may be allowed to detect the deformation of the haptic palm rest piezoelectric elements 621.

In an embodiment, the haptic palm rest support plate 640 may include a number of cavities 641 formed therein. The cavities 641 may be sized to have a relatively smaller diameter than the diameter of each of the respective haptic palm rest piezoelectric elements 621. By including these cavities 641, the haptic palm rest piezoelectric elements 621 may be allowed to deform into the cavities 641 so that the deformation of the haptic palm rest piezoelectric elements 621 creates the haptic palm rest haptic feedback control signal described herein. The depth of the cavities 641 may also be selected to allow for at least a central portion of each haptic palm rest piezoelectric elements 621 to be deflected into the cavities 641 some distance. This distance of deflection, in an embodiment, may be 0.1 mm or smaller or greater according to embodiments herein.

In an embodiment, the touchpad support plate 630 or haptic palm rest support plate 640 may be secured to other rigid elements of the information handling system. In an embodiment, the touchpad support plate 630 or haptic palm rest support plate 640 may be secured to the C-cover substructure 635 via a number of bolts, screws, or other mechanical or chemical coupling device. In some embodiments, the touchpad support plate 630 or haptic palm rest support plate 640 may be a part of the D-cover 665 of the information handling system. In an embodiment, the assemblies 600 and 604 may, once the layers described herein are coupled together, be placed within the C-cover 635 with a D-cover 665 coupled thereto. The assembly of the coversheet 605, C-cover substructure 635, and the D-cover 665 forms a base chassis of the information handling system. In an embodiment, the base chassis may be coupled to a display chassis 650 that may include a display device. The assemblies 600 and 604 described herein may allow the user to provide input to the display device of the display chassis using the capacitive touch layer, the touchpad piezoelectric elements 620 determining actuation, and the haptic feedback capabilities associated with the touchpad piezoelectric elements 620 and haptic palm rest piezoelectric elements 621. By way of example, the capacitive touch layer may allow a user to move a cursor across the screen. In these examples, actuation of the touchpad coversheet layer 605 at a location across the haptic touchpad interface area 602 causes an item to be selected that is represented on the display device. This "click" action may provide similar input to the processor of the information handling system similar to that of a mouse click.

Figure 7:
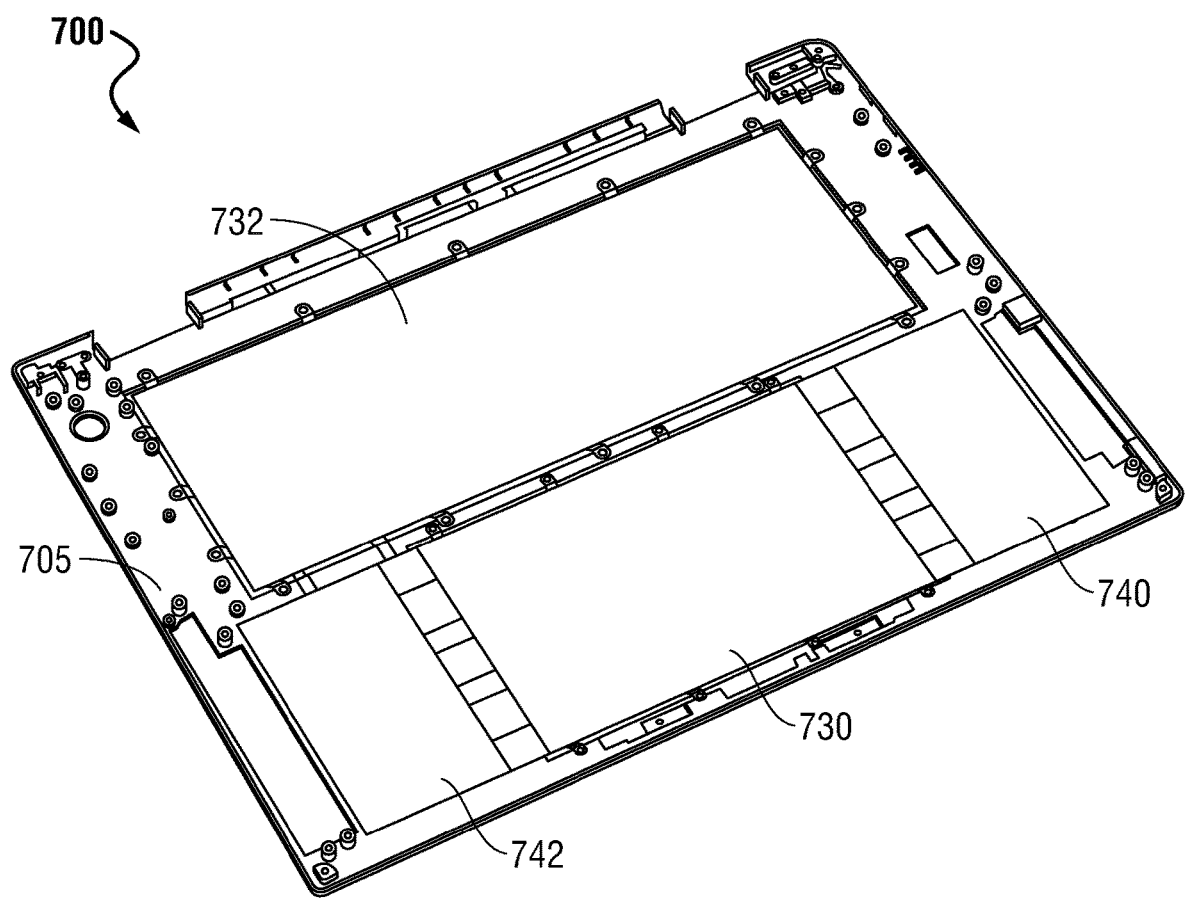
FIG. 7 is back perspective view of a C-cover of an information handling system according to an embodiment of the present disclosure.

FIG. 7 is back perspective view of a C-cover 705 of an information handling system 700 according to an embodiment of the present disclosure. The C-cover 705 may be used to house a keyboard assembly and touchpad assembly as described herein. As also described, each of the keyboard and touchpad assemblies may include a support plate 732 and 730, respectively. Further, the C-cover 705 may include a plurality of haptic palm rest assemblies that may also include haptic palm rest support plates 740 and 742. In an embodiment, a single support plate may be used to support one or more of the haptic touchpad or palm rest piezoelectric element based feedback assemblies described in connection with FIG. 3B and either the touchpad piezoelectric assembly, or the palm rest piezoelectric assembly, both described in connection with FIG. 6. The support plates of the C-cover 705 shown may increase the stiffness of the haptic keyboard and touchpad described herein because the support plates 730, 732, 740, and 742 may be firmly fixed to the C-cover 705. This may enhance the perceived quality of the information handling system while still having a haptic feedback method and system that allows the user to feel as if an actuation of a key or touchpad has occurred. Still further, the haptic feedback systems described herein creates a keyboard or touchpad that feels like a mechanical keyboard vastly reduces physical key travel. Additionally, the construction of the haptic feedback systems described herein results in a much thinner and simpler keyboard and touchpad than that of a mechanical keyboard or touchpad enabling a thinner information handling system in some embodiments. With the reduction in space occupied by the haptic feedback keyboard and touchpad, space within the information handling system base chassis may be increased for use by other, additional, or larger components within the information handling system. In a specific example embodiment, the additional space provided within the information handling system due to the use of a haptic feedback keyboard and touchpad results in the ability to increase the size of a battery used to power the information handling system.

As shown in FIG. 7, the C-cover 705 may include a piezoelectric keyboard portion secured to the C-cover 705 by a first support plate 732, a touchpad portion being secured to the C-cover 705 by a second support plate 730, and two palm rest portions secured to the C-cover 705 by a third and fourth support plate 740, and 741, respectively. In an embodiment, it is contemplated that the touchpad and keyboard as described herein may be secured to the C-cover 705 by a single support plate that combines 730 and 732. It is also contemplated that the touchpad and palm rests may be secured to the C-cover 705 by a single support plate that combines 730, 740, and 742.

Figure 8:
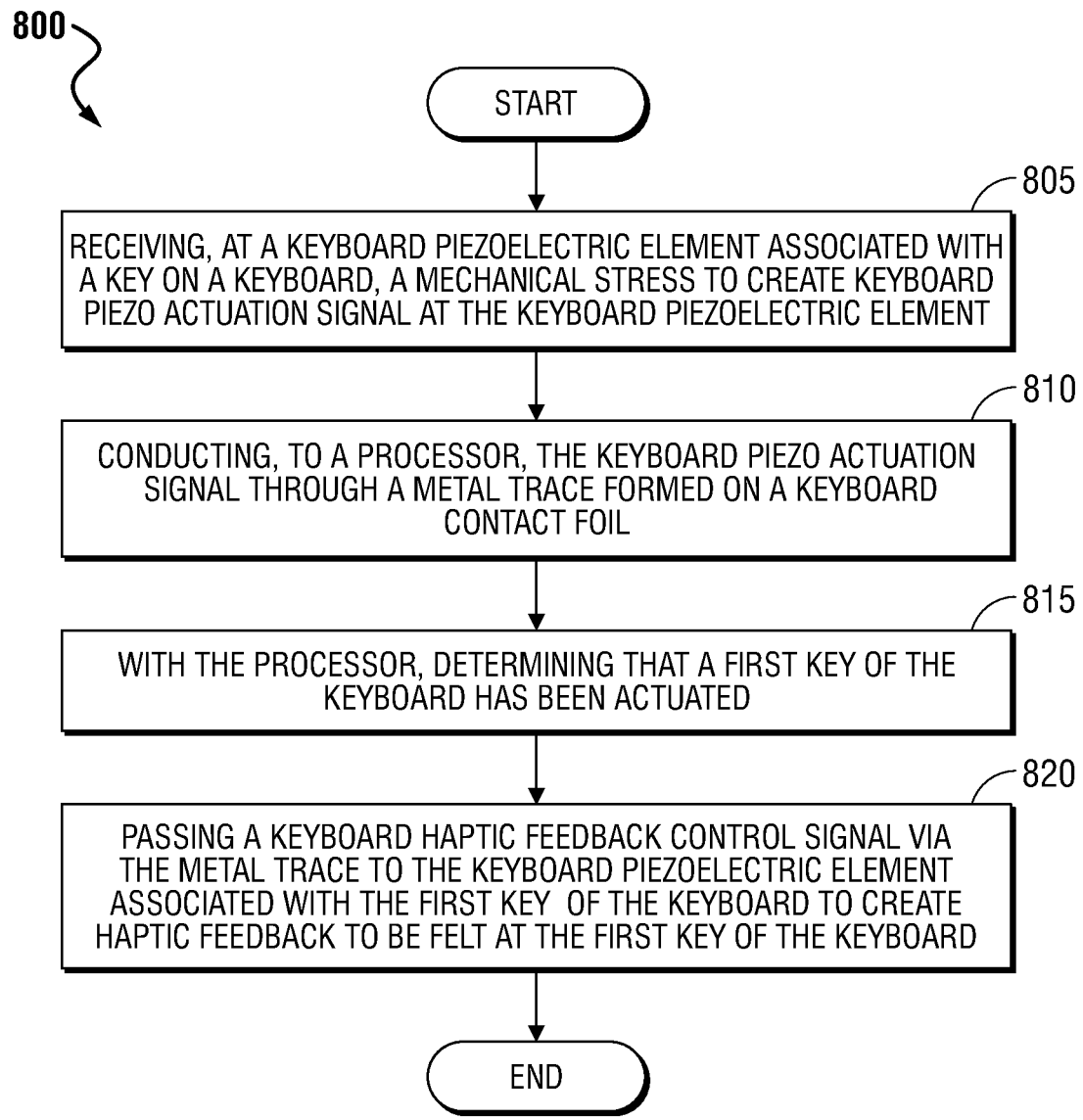
FIG. 8 is a flow diagram illustrating a method of operating a haptic keyboard of an information handling system according to an embodiment of the present disclosure.

FIG. 8 is a flow diagram illustrating a method 800 of operating a haptic keyboard of an information handling system according to an embodiment of the present disclosure. The method 800 may begin by receiving, at a keyboard piezoelectric element associated with a key on a keyboard, a mechanical stress to create a keyboard piezo actuation signal at the keyboard piezoelectric element at block 805. As described herein, the actuation of the key of the keyboard causes a mechanical stress to be placed on a piezoelectric material layer of the keyboard piezoelectric elements. The key on the keyboard may be a key location of a haptic keyboard for a coversheet layer or for a top overlay layer providing key interface locations for a user according to the various embodiments described herein. The deformation of the keyboard piezoelectric material layer results from the application of this mechanical stress which results in the creation of the keyboard piezo actuation signal. Mechanical stress causes deformation of the keyboard piezoelectric elements into a cavity disposed at a keyboard support plate supporting the structures of the keyboard piezoelectric elements thereby compressing the piezoelectric material within the metal disk layer to which it is adhered.

The method 800 may continue, at block 810, with conducting, to a controller or processor, the keyboard piezo actuation signal through a metal trace formed on a keyboard contact foil. The keyboard contact foil may be operatively coupled to the keyboard piezoelectric element such that the charge formed at the keyboard piezoelectric element may be allowed to conduct through at least one metal trace formed thereon and to the controller or processor. In the embodiments described herein, two conductors are connected to the piezoelectric material layer and the metal disk layer to detect a keyboard piezo actuation signal.

The method 800 may continue at block 815 with determining with the controller or processor, that a first key of the keyboard has been actuated. This determination may be made based on the keyboard piezo actuation signal that the controller or processor receives from one or more specific metal traces formed on the keyboard contact foil. Alternative embodiments may be used to allow the controller or processor to determine where and from which key on the keyboard the keyboard piezo actuation signal is received from.

The method 800, may continue at block 820 with passing an electrical response signal to the keyboard piezoelectric element associated with the first key of the keyboard to create keyboard haptic feedback to be felt at the first key of the keyboard. As described herein, the keyboard haptic feedback results from the keyboard haptic feedback control signal, at a determined voltage, current, or polarity being applied to the piezoelectric material layer. The keyboard haptic feedback control signal may be a sine wave, a square wave, pulsed signal, or otherwise varied and modulated to create a keyboard haptic feedback of a key press for the user. Application of the keyboard haptic feedback control signal to the piezoelectric material layer causes the piezoelectric material layer to stretch, compress, or return to its non-deformed state in some embodiments. The new stretched or compressed state of the piezoelectric material layer may create a haptic bump to be felt by the user at the key actuated on the keyboard when the piezoelectric element metal plate layer is warped in response to the keyboard haptic feedback control signal. In one example embodiment, changing polarity and voltage levels in any portion of a keyboard haptic feedback control signal may cause an expansion of the piezoelectric material causing it to stretch and a warping the metal plate layer into the underlying cavity. This may be followed by a keyboard haptic feedback control signal of polarity and voltage level to compress of the piezoelectric material and warp the metal plate away from the cavity. In this way, a keyboard haptic feedback may mimic a mechanical keystroke at the actuated key on as feedback to a user's finger. Any combination of the above changes to the piezoelectric material may be generated by the keyboard haptic feedback control signal for causing the metal plate to warp and generate the intended keyboard haptic feedback event. This method 800, from user actuation of the key to haptic feedback creation, may occur within microseconds of receiving a keyboard piezo actuation signal. The keyboard haptic feedback event may be felt at a haptic key location on a coversheet or on a top overlay that is snugly attached to the haptic keyboard stack up in various embodiments as described herein.

Figure 9:
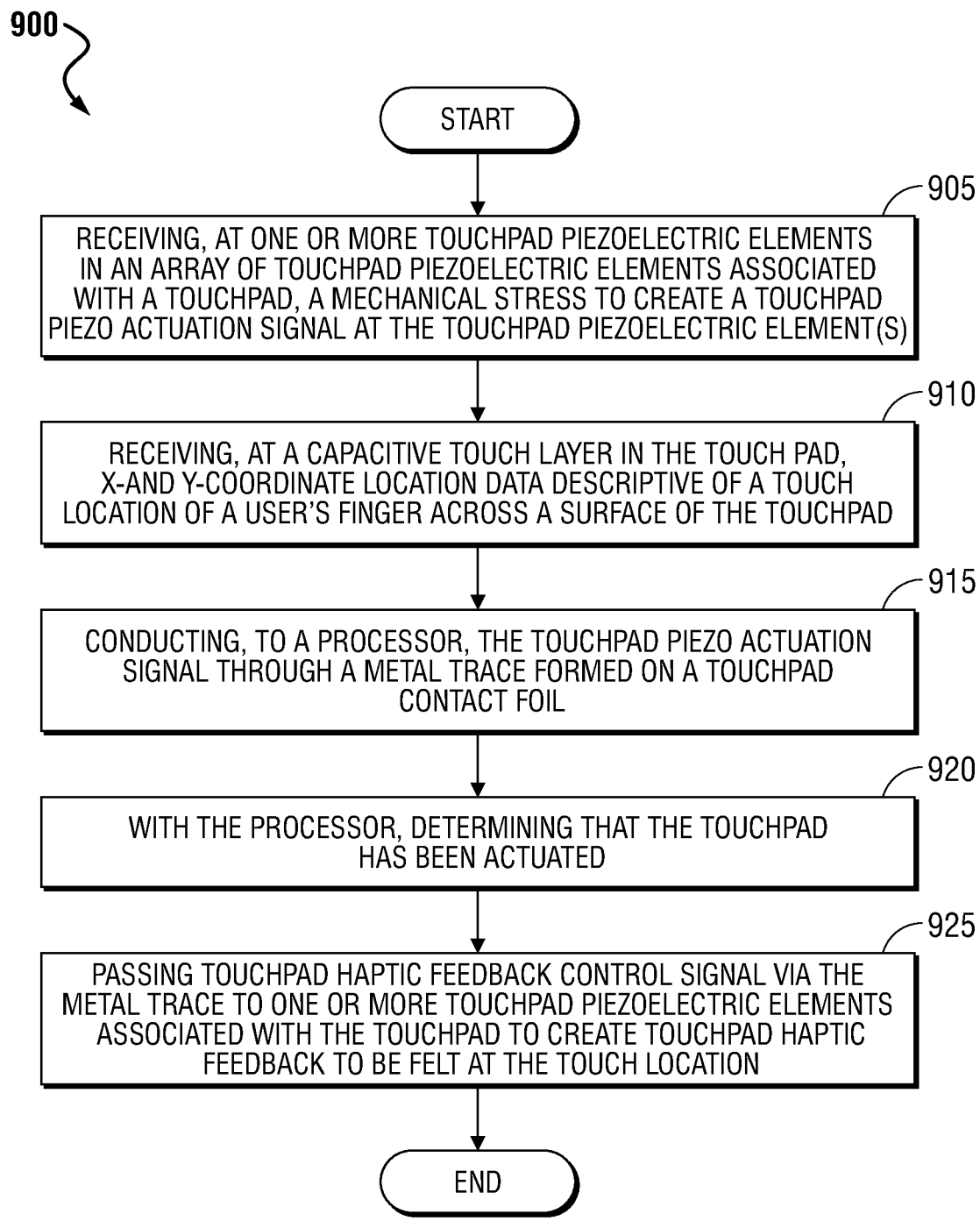
FIG. 9 is a flow diagram illustrating a method of operating a touchpad of an information handling system according to an embodiment of the present disclosure.

FIG. 9 is a flow diagram illustrating a method 900 of operating a touchpad of an information handling system according to an embodiment of the present disclosure. The method 900 may include, at block 905, at least one touchpad piezoelectric element of an array of touchpad piezoelectric elements associated with a touchpad, a mechanical stress to create a touchpad piezo actuation signal at the one or more touchpad piezoelectric elements. As described herein, the actuation of a location on the touchpad causes a mechanical stress to be placed on one or more piezoelectric material layers of the touchpad piezoelectric elements. The actuation interface with actuation interface locations of the haptic touchpad interface area may be disposed on a coversheet layer in a designated touchpad interface portion of a haptic palm rest and touchpad area according to the various embodiments described herein. The deformation of the piezoelectric material layers may result from the application of this mechanical stress, which results in the creation of the touchpad piezo actuation signal. Deformation of the one or more touchpad piezoelectric elements into an underlying cavity formed in the touchpad support plate causes compression of the piezoelectric material. This compression may generate a touchpad piezo actuation signal in the piezoelectric material layer.

The method 900 may continue with receiving, at a capacitive touch layer in the touchpad, x- and y-coordinate location data descriptive of a touch location of a user's finger across a surface of the haptic touchpad interface area at block 910. The x- and y-coordinate location data may be used by a controller or processor in the described method 900 to determine to which touchpad piezoelectric elements to send a touchpad haptic feedback control signal and which palm rest piezoelectric elements fall outside of the haptic touchpad interface area. In these embodiments, the controller or processor may be provided with additional data from a capacitive touch layer that provides the controller or processor with a x- and y-coordinate location on the touchpad that the user has touched in addition to the touchpad piezo actuation signal from one touchpad piezoelectric element. Alternatively, or additionally, the number of touchpad piezoelectric elements actuated by the actuation of the touch of the user may be used to allow the processor to determine where, on the haptic touchpad interface area, the user has touched or if only a haptic palm rest interface area has been touched.

The method 900 may, at block 915, continue with conducting, to a controller or processor, the touchpad piezo actuation signal through metal traces formed on a touchpad contact foil. As described herein, the metal traces may be formed on a touchpad contact foil made of any elastically resilient material that, when any given location on the touchpad is actuated or the touchpad contact foil is bent, the touchpad contact foil returns to its original state when the touchpad contact foil is no longer subjected to a force used to bend the touchpad contact foil. For example, a flexible PCB may be used. Several examples of flexible PCB may include photolithography metal on to a flexible PCB such as a PET material or lamination of metal traces within PET material. Other flexible PCB or circuit materials are also contemplated.

The method 900 may further include, with the controller or processor, determining that the touchpad has been actuated at block 920. In this embodiment, the controller or processor may determine a location along the haptic touchpad interface area where the touchpad piezoelectric element from which the touchpad piezo actuation signal was received is located: across a left side of the haptic touchpad interface area, across a right side of the haptic touchpad interface area, across a top portion of the haptic touchpad interface area, across a bottom portion of the haptic touchpad interface area, or any specific area across the surface of the haptic touchpad interface area.

The method 900 may further include, at block 925, passing a touchpad haptic feedback control signal through the touchpad piezoelectric element associated with the location on the haptic touchpad interface area causing touchpad haptic feedback to be felt at the location on the haptic touchpad interface area of the coversheet or top overlay in various embodiments. As described herein, the touchpad haptic feedback results from the touchpad haptic feedback control signal, at a determined voltage, current, or polarity being applied to the piezoelectric material layer. Application of the touchpad haptic feedback control signal to the piezoelectric material layer causes the piezoelectric material layer to return to its non-deformed state or compressed about the non-deformed state. The new compressed state of the piezoelectric material layer may warp the metal plate of the touchpad piezoelectric element and create a haptic bump or click to be felt by the user as a haptic touchpad feedback at the location on the haptic touchpad interface area actuated on the touchpad. A fast pulse of positive polarized voltage may generate a touchpad haptic feedback that mimics a mechanical click of a touchpad mechanical switch in one example embodiment. This method 900, from user actuation of the touchpad to touchpad haptic feedback creation, may occur within microseconds via the palm rest and touchpad controller.

Figure 10:
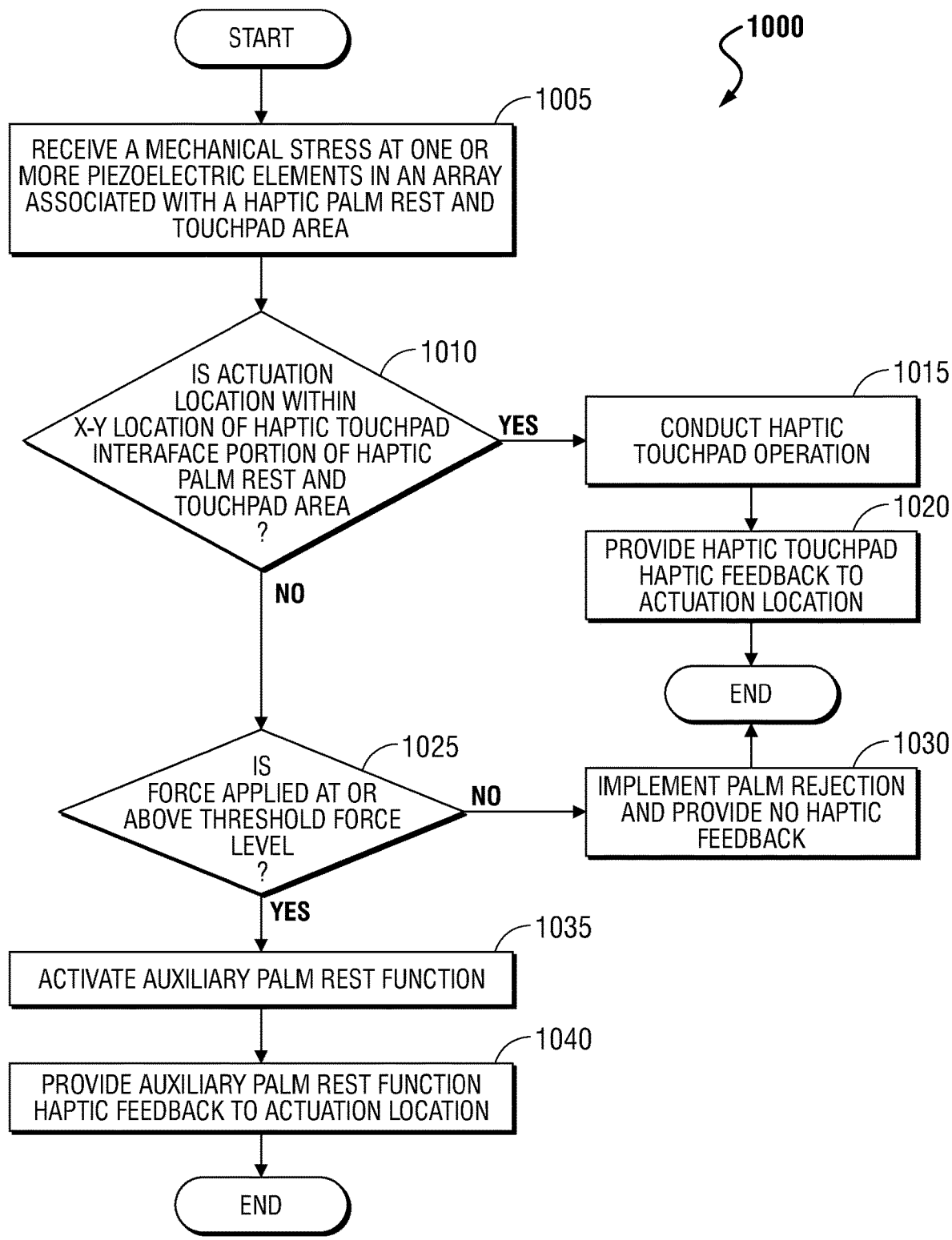
FIG. 10 is a flow diagram illustrating a method of operating a combination haptic palm rest and touchpad area of an information handling system according to an embodiment of the present disclosure.

FIG. 10 is a flow diagram illustrating a method 1000 of operating a combination haptic palm rest and haptic touchpad area of an information handling system according to an embodiment of the present disclosure. The method 1000 may include, at block 1005, a palm rest and touchpad controller receiving a mechanical stress at one or more haptic palm rest and touchpad piezoelectric elements of a combination haptic palm rest and haptic touchpad area. For example, in an embodiment described with reference to FIG. 4 and FIG. 6, a palm rest and touchpad controller may receive such an actuation by mechanical deformation of the haptic palm rest and touchpad area of the coversheet or separate touchpad and palmrest.

At block 1010, a capacitive touch sensor may determine an x-y location of the actuation force applied to the combination haptic palm rest and haptic touchpad area. A haptic palm rest and touchpad controller may execute instructions of a coversheet adaptation system to detect whether the actuation location is within a designated haptic touchpad interface portion of the combination haptic palm rest and haptic touchpad area. If it is within a designated touchpad interface portion of the combination haptic palm rest and haptic touchpad area, the method may proceed to block 1015. At block 1015, the haptic palm rest and touchpad controller may conduct a touchpad operation, such as selection of an item on a display screen, according to the embodiment described herein include those described with respect to FIG. 9. The method may proceed to block 1020, where the haptic palm rest and touchpad controller may send a haptic touchpad control signal to the piezoelectric elements at the actuation location to generate a haptic touchpad feedback that may be tactile, sound, or both. Generation of the touchpad actuation signal and generation of the haptic touchpad feedback control signal to the piezoelectric elements and generation of the haptic touchpad feedback event at the combination haptic palm rest and haptic touchpad area may occur in accordance with embodiments herein including as described in FIG. 9. At this point, the method may end although the haptic keyboard and touchpad control system may continue to monitor for ongoing actuation events while the information handling system is operational.

If the actuation location detected by the capacitive touch layer at block 1010 is not within a designated haptic touchpad interface portion of the combination haptic palm rest and haptic touchpad area, then the method may proceed to block 1025. At block 1025, the haptic palm rest and piezoelectric elements in some embodiments or a thin film force detection layer may detect the level of force applied at an actuation point on the combination haptic palm rest and haptic touchpad area. The coversheet adaptation control system in embodiments herein may determine if the applied force meets or exceeds a force threshold layer and determine whether to activate auxiliary palm rest functions of the combination haptic palm rest and haptic touchpad area. In some embodiments herein, even if the actuation location is detected within a haptic touchpad interface portion of the combination haptic palm rest and haptic touchpad area at block 1010, but the force applied exceeds a threshold as described in block 1025, flow may proceed to activation of auxiliary palm rest functions even at the designated haptic touchpad interface portion of the combination haptic palm rest and haptic touchpad area. In some embodiments, one force level within the designated haptic touchpad interface area may actuate a click or signal while a second force level may activate the auxiliary palm rest functions. It is contemplated that the second force level may be greater than the first force level in some embodiments while the reverse may be true in other embodiments.

If at block 1025, the force applied to the actuation location of the combination haptic palm rest and haptic touchpad area is not above a threshold level, or is not within a haptic touchpad interface portion of the combination haptic palm rest and haptic touchpad area, the method may proceed to block 1030. At block 1030, it may be determined that no activation of auxiliary haptic palm rest function has occurred due to the level of force applied and the location on the combination haptic palm rest and haptic touchpad area in an embodiment. For example, a user's palms may be resting on the palm rest. In such an embodiment, the haptic palm rest and touchpad controller may implement palm rejection of the detected palms for the capacitive touch sensing layer and may issue not haptic feedback to the combination haptic palm rest and haptic touchpad area.

If at block 1025, the force applied to the actuation location of the combination haptic palm rest and haptic touchpad area is above a threshold level, then the method may proceed to block 1035. At block 1035, the coversheet adaptation control system may provide for an auxiliary palm rest function to be applied for any detected actuation across the combination haptic palm rest and haptic touchpad area in some embodiments herein. For example, an auxiliary haptic palm rest function may include force activated auxiliary keys, stylus writing haptic feedback, weight measurement applications or similar functions specific to operation software applications. For example, auxiliary haptic palm rest keys may be designated on the combination haptic palm rest and haptic touchpad area along a side or bottom as volume control, brightness control, or other auxiliary control haptic keys or haptic toggles in some embodiments. In another example embodiment, a stylus may be used to write on the combination haptic palm rest and haptic touchpad area and with meeting or exceeding a force threshold, writing haptics and sound may be provided. Other example auxiliary haptic palm rest functions for applications of the information handling system are contemplated as well and may be similarly specific to those applications.

The method may proceed to block 1040 for transmission of an auxiliary palm rest haptic feedback control signal to a haptic combination touchpad and palm rest assembly. At block 1040, the haptic palm rest and touchpad controller may pass an auxiliary palm rest haptic feedback control signal through the haptic palm rest and touchpad piezoelectric element or elements to be felt or heard at a location of the combination haptic palm rest and haptic touchpad area in various embodiments. As described herein, the palm rest and touchpad haptic feedback results from the palm rest and touchpad haptic feedback control signal, at a determined voltage, current, or polarity being applied to the piezoelectric material layer of one or more haptic palm rest and touchpad piezoelectric elements under the combination haptic palm rest and haptic touchpad area as described in embodiments herein.

In other embodiments, an operating software application may provide a haptic tactile feedback control signal or an audio signal from an audio controller to a haptic palm rest and haptic touchpad controller at block 1040. In such embodiments, the haptic palm rest and haptic touchpad controller may pass the application haptic tactile feedback control signal or audio signal to the haptic palm rest and touchpad piezoelectric elements to generate a haptic tactile or audio feedback at the haptic palm rest and touchpad area in accordance with those signals. The method may then end.

Figure 11:
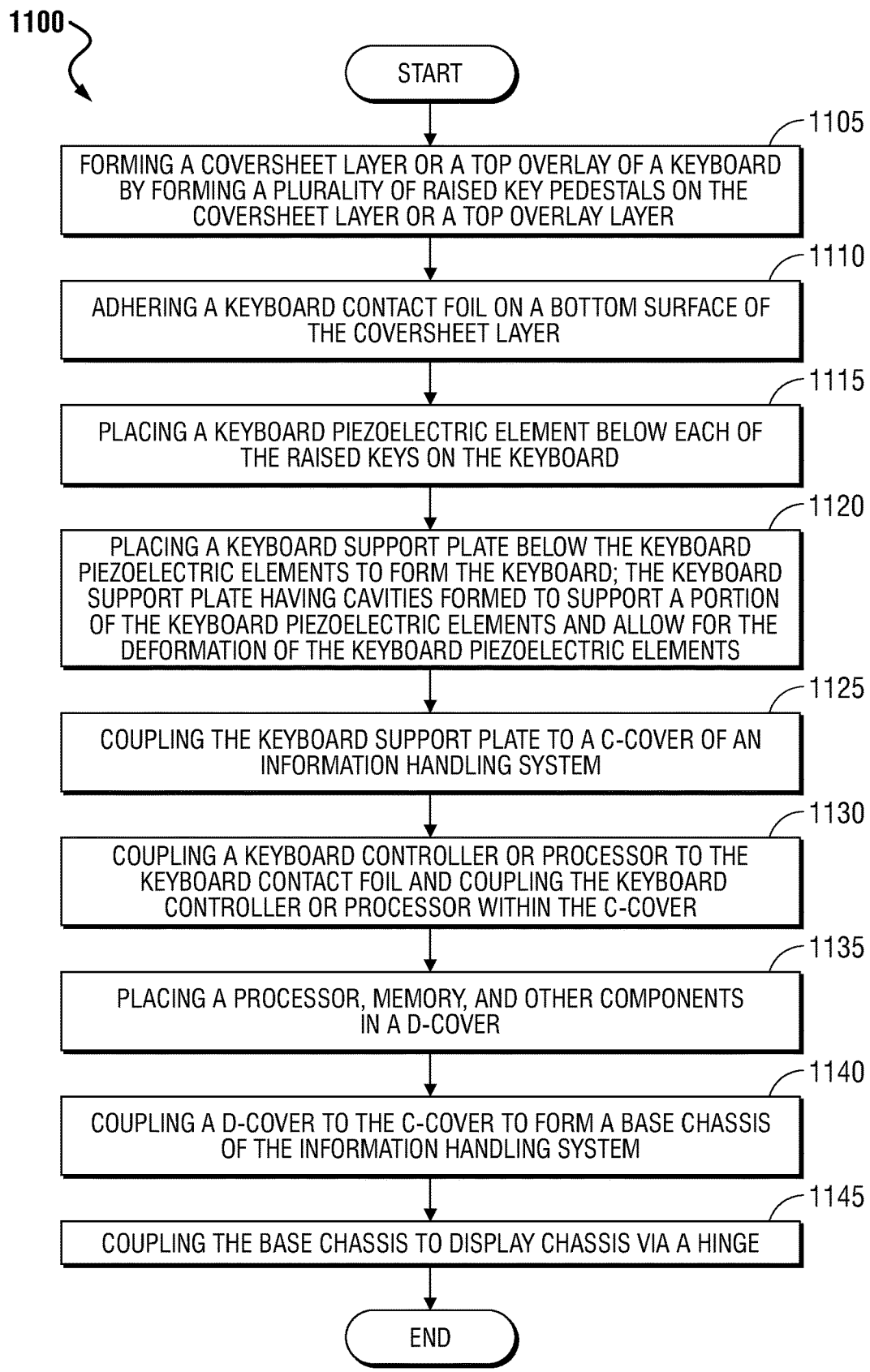
FIG. 11 is a flow diagram illustrating a method of manufacturing a keyboard of an information handling system according to an embodiment of the present disclosure.

FIG. 11 is a flow diagram illustrating a method 1100 of manufacturing a keyboard of an information handling system according to an embodiment of the present disclosure. The method 1100 may include forming a coversheet layer via an injection molding process or with utilization of a plurality of other materials to form a single coversheet material layer. With the coversheet layer, the method may proceed by forming a plurality of keys on a keyboard on the coversheet layer or an optional top overlay layer magnetically attachable to the coversheet layer at block 1105. In an embodiment, the shape of the coversheet layer or the optional top overlay layer may be such so as to conform to the user's fingers. In an embodiment, in order to shape the coversheet layer or the optional top overlay layer, the material used to form the coversheet layer may be subjected to an injection molding process forming ergonomically shaped key location designations. As such, a top portion of the coversheet layer or the optional top overlay layer may be formed to be ergonomically beneficial to a user's actuation such as by providing key pedestals, key frame, or other tactile or visual designation of a key and by conforming to the user's fingers, for example. The injection molding process may be completed prior to the installation of the coversheet layer into the remaining layers within the keyboard as described herein.

The coversheet may include one or more magnets, ferromagnetic inserts, or Hall effect sensors according to various embodiments described herein. The optional top overlay layer may be magnetically attachable or otherwise adhered mechanically or via reusable adhesive over the coversheet layer in some embodiments. In embodiments with the optional top overlay layer attachable to the coversheet, some embodiments may have the optional top overlay layer attached over a default keyboard, such as a QWERTY-type keyboard in the coversheet. In other embodiments, the coversheet may be flat or have guide structures as described herein to align the optional top overlay layer to attach to the coversheet layer. Any number of processes may be included with the injection molding process. In an embodiment, the injection molding process used to form the coversheet layer may include forming a number of holes within a sheet of, for example, ABS. These holes may correlate with each actuatable key to be formed on the keyboard. The formation of the coversheet layer may continue with injection molding a translucent ABS through the holes to form a raised portion correlating with each of the number of keys on the keyboard. Opposite the raised portions a number of runners may be machined away to accommodate for receipt of other layers of the keyboard such as each of the keyboard piezoelectric elements. The surface of the coversheet layer on which the raised portions are formed may be painted and any number or type of graphics may be laser etched or painted on each raised portion or other indicators indicating a specific key of the keyboard.

The method 1100 may continue with adhering a keyboard contact foil on a bottom surface of the coversheet layer at block 1110. Adhering, the keyboard contact foil to the coversheet layer may include depositing an adhesive to the bottom surface of the coversheet layer and placing the keyboard contact foil to the bottom surface of the coversheet layer. The adhesive may be any type of adhesive.

The method 1100 may, at block 1115, include placing a keyboard piezoelectric element below each of the keys on the keyboard. In this embodiment, the number of keys formed in the keyboard may vary based on the number and arrangement of keys to be used as input to the information handling system. For example, the number of keyboard piezoelectric elements may be equal to a number of numerical keys to be formed on a ten-key type input device. Additionally, the number of keyboard piezoelectric elements may be equal to a number of alphanumeric keys to be formed on a QWERTY-type keyboard. Alternative and customized keyboards are contemplated under the concepts described herein and the present description contemplates these alternative keyboard layouts.

The method 1100 may also include, at block 1120, placing a keyboard support plate below the keyboard piezoelectric elements; the support plate having cavities formed to support a portion of the keyboard piezoelectric elements and allows for the deformation of the keyboard piezoelectric elements into the underlying cavities. As described herein, the keyboard support plate may both hold the layers of the keyboard together including the outer edges of the keyboard piezoelectric elements as well as maintain the keyboard to a more rigid portion of the information handling system. The method 1100 also includes, at block 1125, coupling the support plate to the C-cover via a number of screws, bolts or other type of coupling device described herein.

The method 1100 may also include coupling a keyboard controller or processor to the keyboard contact foil and coupling the keyboard controller or processor within the C-cover at block 1130. The method may continue with placing other processors, a memory, and power systems (e.g. batteries or power transformers and the like) as well as other information handling system components in the C-cover or D-cover at block 1135. The processor may be any type of processing device that may access data from the memory and receive piezo actuation signals from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1100 also includes, at block 1140, the coupling a D-cover to the C-cover to form a base chassis of the information handling system. In an embodiment, the C-cover may also include a haptic touchpad pad described herein, a haptic palm rest assembly, or a standard mechanical touchpad. With a haptic keyboard, haptic touchpad, and haptic palm rest, a simple uniform coversheet may be used in some embodiments. In other embodiments incorporating a combination haptic touchpad and palm rest, an additional force-sensing film may be placed atop the combination haptic touchpad interface and palm rest area of the cover sheet. The method 1100 may further include coupling the base chassis to a display chassis via a hinge at block 1145. The base chassis and display chassis may form a notebook-type information handling system.

Figure 12:
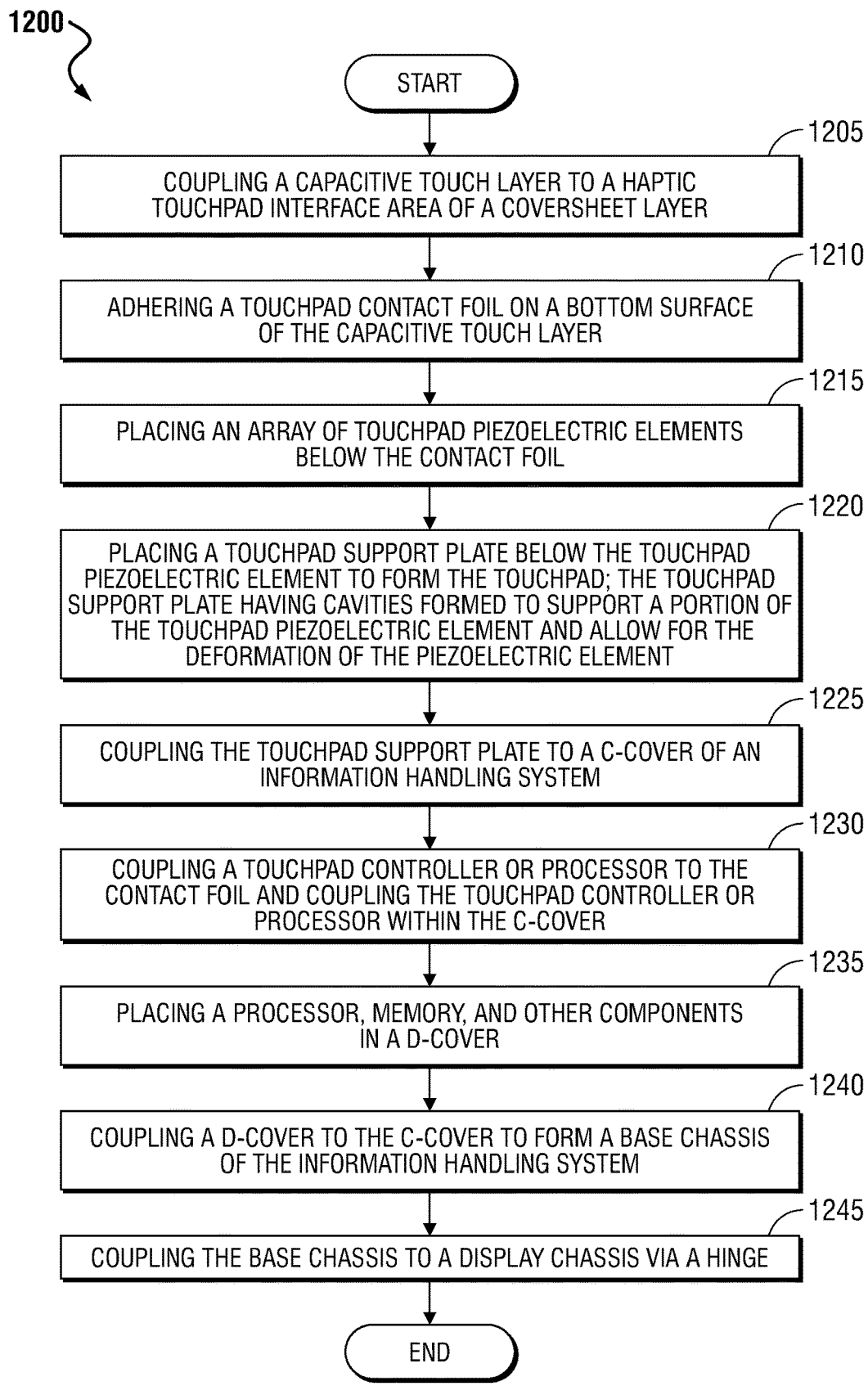
FIG. 12 is a flow diagram illustrating a method of manufacturing a touchpad of an information handling system according to an embodiment of the present disclosure.

FIG. 12 is a flow diagram illustrating a method of manufacturing a touchpad of an information handling system according to an embodiment of the present disclosure. The method 1200 may include coupling a capacitive touch layer to a haptic touchpad interface area of a coversheet layer at block 1205. The capacitive touch layer may be coupled to the coversheet layer using any type of adhesive. In some embodiments, the capacitive touch layer may be formed on the touchpad contact foil or a stiffener layer.

The method 1200 may continue with adhering a touchpad contact foil on a bottom surface of the capacitive touch layer at block 1210. Adhering, the touchpad contact foil to the capacitive touch layer may include depositing an adhesive to the bottom surface of the capacitive touch layer and placing the touchpad contact foil to the bottom surface of the capacitive touch layer. The adhesive may be any type of adhesive.

The method 1200 may, at block 1215, include placing a plurality of touchpad piezoelectric elements below the touchpad contact foil in an array to operate as a touchpad as described herein. In this embodiment, the number of touchpad piezoelectric elements may vary based on an arrangement of the touchpad to be used as input to the information handling system. For example, the number of touchpad piezoelectric elements may be spaced under the coversheet area designated as the touchpad to provide one or more touchpad piezoelectric elements within all locations of the haptic touchpad interface area. In an example embodiment, the array of touchpad piezoelectric elements may be spaced such that at least one touchpad piezoelectric element is between 1 cm to 10 cm of any location on the designated haptic touchpad interface area.

The method 1200 may also include, at block 1215, placing a touchpad support plate below the touchpad piezoelectric elements to form the touchpad. The touchpad support plate has cavities formed therein to support a portion of the touchpad piezoelectric element while allowing for the deformation of the touchpad piezoelectric elements. As described herein, the support may both hold the layers of the touchpad together and outer edges of the touchpad piezoelectric elements as well as maintain the touchpad to a more rigid portion of the information handling system. The method 1200 also includes, at block 1225, coupling the touchpad support plate to the C-cover via a number of screws, bolts or other type of coupling device described herein.

The method 1200 may also include coupling a palm rest and touchpad controller or processor to the touchpad contact foil and coupling the palm rest and touchpad controller or processor within the C-cover at block 1230. The method may continue with placing other processors, a memory, and power systems (e.g. batteries or power transformers and the like) and other information handling system components in the C-cover or D-cover at block 1235. The processor may be any type of processing device that may access data from the memory and receive piezo actuation signals from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1200 also includes, at block 1240, the coupling a D-cover to the C-cover to form a base chassis of the information handling system. In an embodiment, the C-cover may also include a haptic keyboard, or a haptic palm rest, as described herein. In an alternative embodiment, a mechanical or other type of keyboard may be used. The method 1200 may further include coupling the base chassis to a display chassis via a hinge at block 1245. The base chassis and display chassis may form a notebook-type information handling system in an example embodiment.

Figure 13:
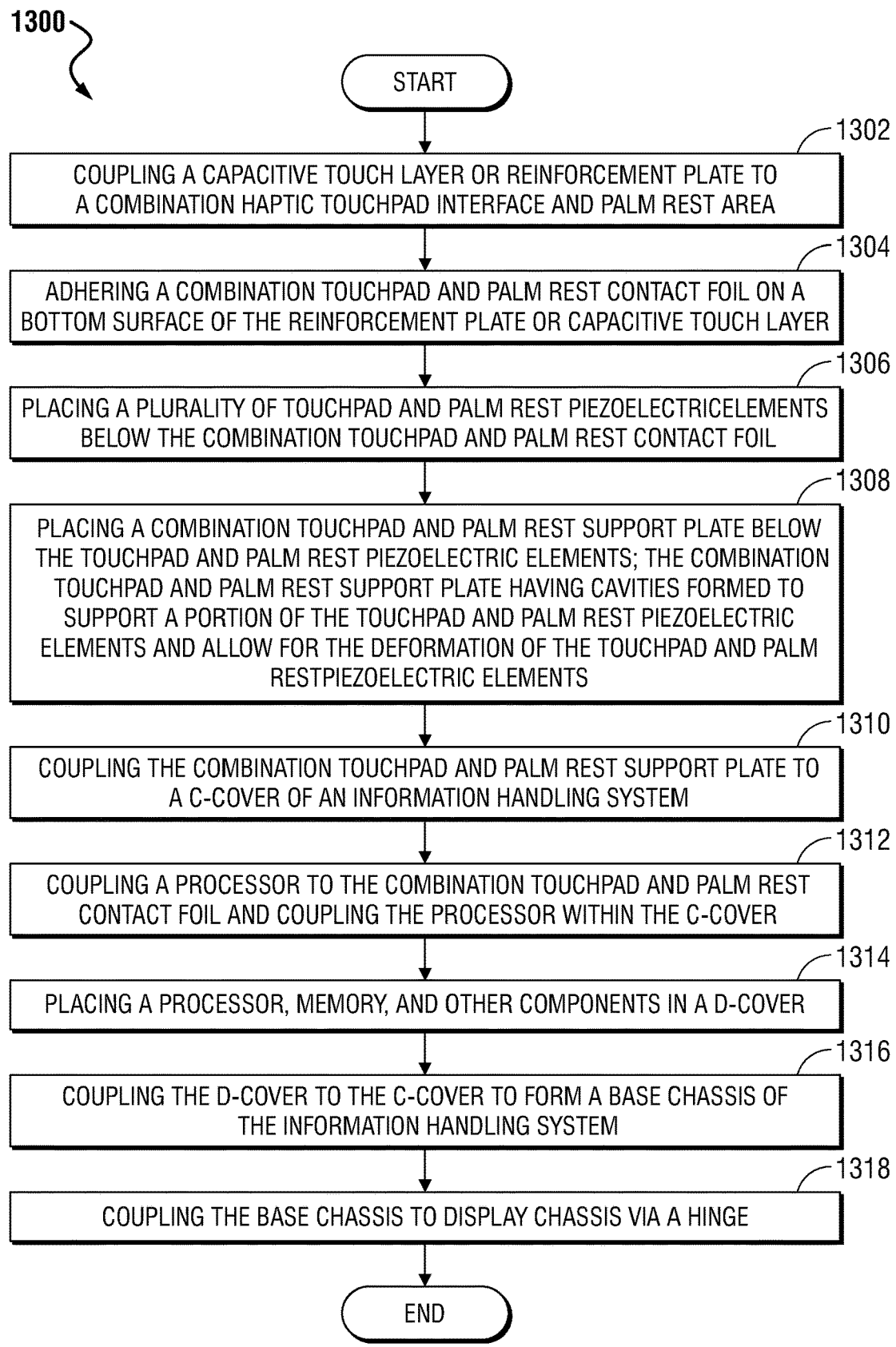
FIG. 13 is a flow diagram illustrating a method of manufacturing a haptic combination touchpad and palm rest according to an embodiment of the present disclosure.

FIG. 13 is a flow diagram illustrating a method of manufacturing a haptic combination touchpad and palm rest of an information handling system according to an embodiment of the present disclosure. The method 1300 may include coupling a capacitive touch layer to a combination haptic touchpad interface and palm rest area of a coversheet layer at block 1302. The capacitive touch layer may be coupled to the coversheet layer using any type of adhesive. In some embodiments, the capacitive touch layer may be formed on the combination touchpad and palm rest contact foil or a reinforcement plate or layer. In some embodiments, a thin film force sensing layer may be disposed between the capacitive touch layer and coversheet. In other embodiments, the thin film force sensing layer may be disposed below the capacitive touch layer. For example, depending on the thickness or stiffness of the coversheet layer, a thin film force layer may be utilized to detect force levels applied to the haptic combination touchpad and palm rest area of the C-cover in some example embodiments.

The method 1300 may continue with adhering a combination touchpad and palm rest contact foil on a bottom surface of the capacitive touch layer at block 1304. Adhering, the combination touchpad and palm rest contact foil to the capacitive touch layer may include depositing an adhesive to the bottom surface of the capacitive touch layer and placing the combination touchpad and palm rest contact foil to the bottom surface of the capacitive touch layer. The adhesive may be any type of adhesive.

The method 1300 may, at block 1306, include placing a plurality of touchpad and palm rest piezoelectric elements below the combination touchpad and palm rest contact foil in an array to operate as a combination touchpad and palm rest as described herein. In this embodiment, the number of touchpad and palm rest piezoelectric elements may vary based on an arrangement of the combination touchpad and palm rest to be used as input to the information handling system. For example, the number of touchpad and palm rest piezoelectric elements may be spaced under the coversheet area designated as the haptic combined touchpad interface and palm rest area to provide one or more touchpad and palm rest piezoelectric elements within all locations of the combination haptic touchpad interface and palm rest area. In an example embodiment, the array of touchpad and palm rest piezoelectric elements may be spaced such that at least one touchpad and palm rest piezoelectric element is between 1 cm to 10 cm of any location on the designated combination haptic touchpad interface and palm rest area.

The method 1300 may also include, at block 1308, placing a combination touchpad and palm rest support plate below the touchpad and palm rest piezoelectric elements. The combination touchpad and palm rest support plate has cavities formed therein to support a portion of the touchpad and palm rest piezoelectric elements while allowing for the deformation of the touchpad and palm rest piezoelectric elements. As described herein, the support may both hold the layers of the touchpad together and outer edges of the touchpad and palm rest piezoelectric elements as well as maintain the touchpad and palm rest to a more rigid portion of the information handling system. The method 1300 also includes, at block 1310, coupling the combination touchpad and palm rest support plate to the C-cover via a number of screws, bolts or other type of coupling device described herein.

The method 1300 may also include coupling a combination palm rest and touchpad controller or processor to the combination touchpad and palm rest contact foil and coupling the combination palm rest and touchpad controller or processor within the C-cover at block 1312. The method may continue with placing other processors, a memory, and power systems (e.g. batteries or power transformers and the like) and other information handling system components in the C-cover or D-cover at block 1314. The processor may be any type of processing device that may access data from the memory and receive piezo actuation signals from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1300 also includes, at block 1316, the coupling a D-cover to the C-cover to form a base chassis of the information handling system. In an embodiment, the C-cover may also include a haptic keyboard, as described herein. In an alternative embodiment, a mechanical or other type of keyboard may be used. The method 1300 may further include coupling the base chassis to a display chassis via a hinge at block 1318. The base chassis and display chassis may form a notebook-type information handling system in an example embodiment.

Figure 14:
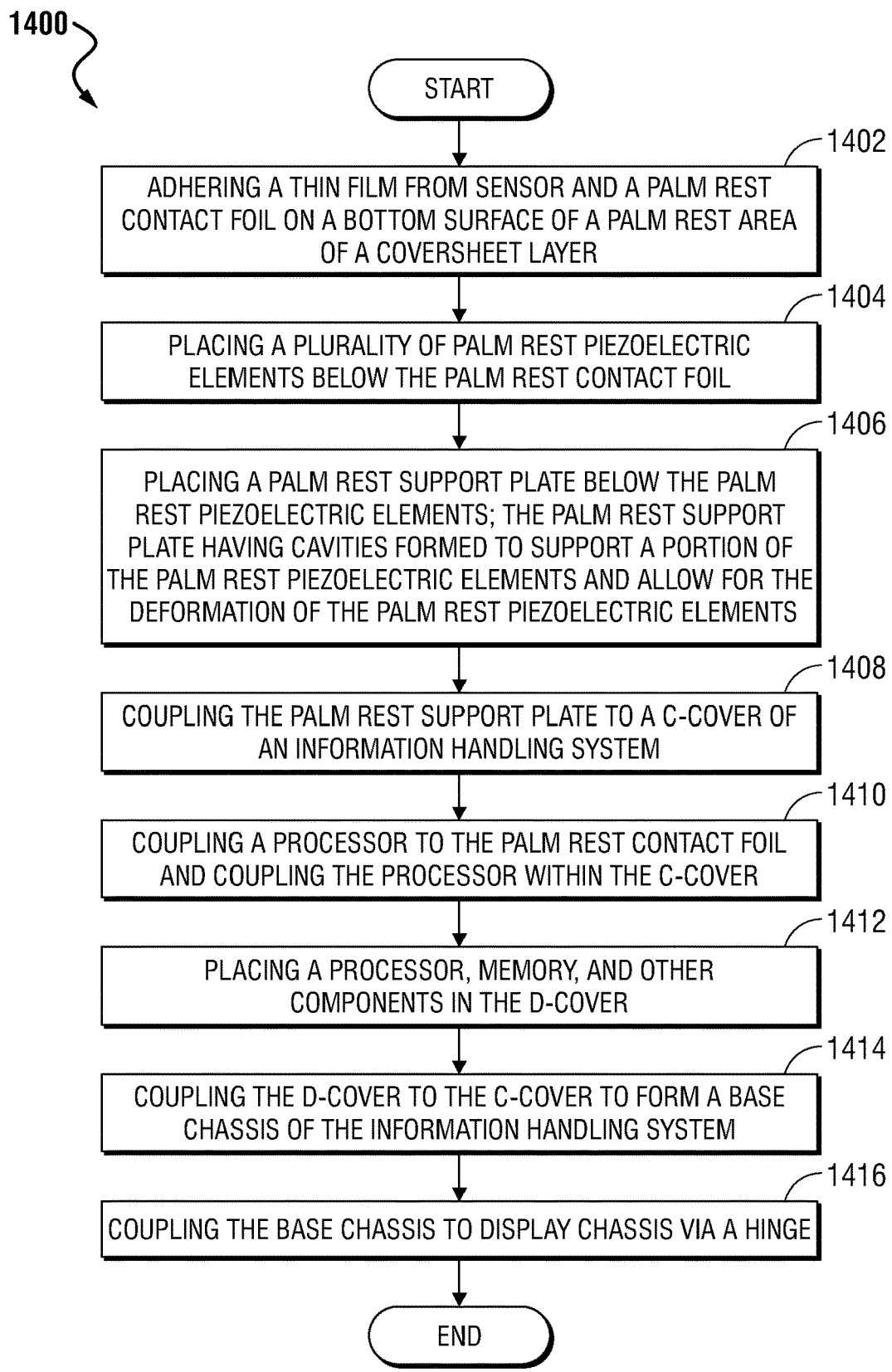
FIG. 14 is a flow diagram illustrating a method of manufacturing a palm rest of an information handling system according to an embodiment of the present disclosure.

FIG. 14 is a flow diagram illustrating a method of manufacturing a palm rest of an information handling system according to an embodiment of the present disclosure. The method 1400 may include adhering a palm rest contact foil on a bottom surface of a palm rest area of a coversheet layer at block 1402. In some embodiments, a thin film force sensing layer may be disposed between the palm rest contact foil and coversheet. In other embodiments, the thin film force sensing layer may be disposed above or below a capacitive touch layer disposed between a palm rest contact foil layer and the coversheet. For example, depending on the thickness or stiffness of the coversheet layer, a thin film force layer may be utilized to detect force levels applied to the haptic combination touchpad and palm rest area of the C-cover in some example embodiments Adhering the palm rest contact foil to the coversheet layer, or to intervening thin film force sensing layer or capacitive touch layer, may include depositing an adhesive to the bottom surface of the coversheet layer and placing adhesive between the intervening thin file force sensing layer, capacitive touch layer, and the palm rest contact foil. The adhesive may be any type of adhesive.

The method 1400 may, at block 1404, include placing a plurality of palm rest piezoelectric elements below the palm rest contact foil in an array to operate as a haptic palm rest as described herein. In this embodiment, the number of palm rest piezoelectric elements may vary based on an arrangement of the palm rest to be used as input to the information handling system. For example, the number of palm rest piezoelectric elements may be spaced under the coversheet area designated as the palm rest to provide one or more palm rest piezoelectric elements within all locations of the haptic palm rest area. In an example embodiment, the array of palm rest piezoelectric elements may be spaced such that at least one palm rest piezoelectric element is between 1 cm to 10 cm of any location on the designated palm rest area.

The method 1400 may also include, at block 1406, placing a palm rest support plate below the palm rest piezoelectric elements. The palm rest support plate has cavities formed therein to support a portion of the palm rest piezoelectric element while allowing for the deformation of the palm rest piezoelectric elements. As described herein, the support may both hold the layers of the haptic palm rest assembly together and outer edges of the palm rest piezoelectric elements as well as maintain the palm rest to a more rigid portion of the information handling system. The method 1300 also includes, at block 1408, coupling the palm rest support plate to the C-cover via a number of screws, bolts or other type of coupling device described herein.

The method 1400 may also include coupling a palm rest and touchpad controller or processor to the palm rest contact foil and coupling the palm rest and touchpad controller or processor within the C-cover at block 1410. The method may continue with placing other processors, a memory, and power systems (e.g. batteries or power transformers and the like) and other information handling system components in the C-cover or D-cover at block 1412. The processor may be any type of processing device that may access data from the memory and receive piezo actuation signals from the various piezoelectric devices as described herein. Other components in accordance with the information handling system of FIG. 1 may also be installed in the C-cover or D-cover assembly according to techniques understood in the art for creating motherboards, graphics boards, wireless systems, power systems, bus systems, data ports, cooling systems and the like.

The method 1400 also includes, at block 1414, coupling a D-cover to the C-cover to form a base chassis of the information handling system. In an embodiment, the C-cover may also include a haptic keyboard, or a haptic palm rest, as described herein. In an alternative embodiment, a mechanical or other type of keyboard may be used. The method 1400 may further include coupling the base chassis to a display chassis via a hinge at block 1416. The base chassis and display chassis may form a notebook-type information handling system in an example embodiment.

The blocks of the flow diagrams of FIGS. 8, 9, 10, 11, 12, 13, and 14 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A keyboard, touchpad, and palm rest haptic response system of an information handling system, comprising:

a coversheet to identify a key location of a haptic keyboard, a haptic palm rest area, and a haptic touchpad interface portion on a C-cover for the information handling system;

a haptic palm rest piezoelectric element based feedback assembly disposed beneath the palm rest area and secured to the C-cover and including a plurality of haptic palm rest piezo electric elements and a plurality of haptic touchpad piezoelectric elements beneath the haptic palm rest area including the haptic touchpad interface portion and secured to the C-cover, where at least one haptic palm rest piezo electric element generates a palm rest piezo actuation signal and generates a palm rest haptic feedback;

a haptic keyboard piezoelectric element based feedback assembly disposed beneath the haptic keyboard and secured to the C-cover;

a keyboard controller to receive a keyboard piezo actuation signal from a keyboard piezoelectric element and send a keyboard haptic feedback control signal to the keyboard piezoelectric element to cause the keyboard piezoelectric element to generate a keyboard haptic feedback at the key location; and a palm rest and touchpad controller to receive the palm rest piezo actuation signal from the at least one palm rest piezoelectric element and to send a palm rest haptic feedback control signal to the at least one palm rest piezoelectric element when a threshold of applied force has been met or exceeded on the haptic palm rest area to cause the palm rest piezoelectric element to generate the palm rest haptic feedback at a palm rest location of actuation.

2. The system of claim 1, wherein the haptic keyboard piezoelectric element based feedback assembly further comprises:

a keyboard contact foil placed between the coversheet and a keyboard support layer; and a keyboard piezoelectric element placed between the keyboard contact foil and the keyboard support layer to receive an applied mechanical stress at the key location and generate the keyboard piezo actuation signal.

3. The system of claim 1, wherein the haptic touchpad piezoelectric element based feedback assembly further comprises:

a palm rest and touchpad contact foil placed between the coversheet and a palm rest and touchpad support layer; and a palm rest or touchpad piezoelectric element placed between the touchpad contact foil and the touchpad support layer to receive an applied mechanical stress at the location within the haptic palm rest interface area and generate the palm rest piezo actuation signal.

4. The system of claim 1, wherein haptic palm rest piezoelectric element based feedback assembly further comprises:

a capacitive touch layer situated beneath the haptic palm rest area including haptic touchpad interface area to receive x- and y-coordinate location data to determine touch location at a designated touchpad interface area to operate the haptic touchpad portion.

5. The system of claim 1, wherein the haptic palm rest piezoelectric element based feedback assembly further comprises:

a palm rest contact foil placed between the coversheet and a palm rest support layer; and a palm rest piezoelectric element placed between the palm rest contact foil and the palm rest support layer to receive the palm rest haptic feedback control signal and to generate the palm rest haptic feedback at a location in the palm rest area.

6. The system of claim 1, wherein the palm rest and touchpad controller sends the palm rest haptic feedback control signal to generate tactile haptic feedback based on a received code instruction from a software application currently running on the information handling system.

7. The system of claim 6, wherein the palm rest and touchpad controller sends the palm rest haptic feedback control signal based on an audio signal from an audio controller.

8. A keyboard, and combination touchpad and palm rest haptic response system of an information handling system, comprising:

a coversheet to identify a key location of a haptic keyboard, and a combination haptic touchpad interface and palm rest area on a C-cover for the information handling system;

a haptic combination touchpad and palm rest piezoelectric element based feedback assembly disposed beneath the haptic combination touchpad interface and palm rest area and secured to the C-cover;

a haptic keyboard piezoelectric element based feedback assembly disposed beneath the haptic keyboard and secured to the C-cover;

a keyboard controller to receive a keyboard piezo actuation signal from a keyboard piezoelectric element and send a keyboard haptic feedback control signal to the keyboard piezoelectric element to cause the keyboard piezoelectric element to generate a keyboard haptic feedback at the key location; and a palm rest and touchpad controller to receive an actuation signal from a touchpad and palm rest piezoelectric element, where the touchpad and palm rest piezo electric element is configured to generate a touchpad actuation signal and a palm rest piezo actuation signal and configured to generate a touchpad haptic feedback and a palm rest haptic feedback; and the palm rest and touchpad controller to either send a touchpad haptic feedback control signal to generate the touchpad haptic feedback signal or to send a palm rest haptic feedback control signal to generate the palm rest haptic feedback at the touchpad and palm rest piezoelectric element at an actuation location depending on force applied to the combination haptic touchpad interface and palm rest area meeting a threshold level.

9. The system of claim 8, wherein the haptic keyboard piezoelectric element based feedback assembly further comprises:

a keyboard contact foil placed between the coversheet and a keyboard support layer; and a keyboard piezoelectric element placed between the keyboard contact foil and the keyboard support layer to receive an applied mechanical stress at the key location and generate the keyboard piezo actuation signal.

10. The system of claim 8, wherein the haptic combination touchpad and palm rest piezoelectric element based feedback assembly further comprises:

a touchpad and palm rest contact foil placed between the coversheet and a touchpad and palm rest support layer; and the touchpad and palm rest piezoelectric element placed between the touchpad and palm rest contact foil and the touchpad and palm rest support layer to receive an applied mechanical stress at the location within the haptic combination touchpad and palm rest area and generate the touchpad and palm rest actuation signal.

11. The system of claim 10, wherein the haptic combination touchpad and palm rest piezoelectric element based feedback assembly further comprises:

a capacitive touch layer situated beneath the haptic combination touchpad and palm rest area and operatively coupled to a bottom surface of the coversheet to receive x- and y-coordinate location data.

12. The system of claim 8, wherein the haptic combination touchpad and palm rest piezoelectric element based feedback assembly further comprises:

a thin coversheet material over the haptic combination touchpad and palm rest area and detecting downward force applied to the haptic combination touchpad and palm rest area via the touchpad and palm rest piezoelectric element.

13. The system of claim 8, wherein the haptic combination touchpad and palm rest piezoelectric element based feedback assembly further comprises:
a force-sensing material disposed atop the haptic combination touchpad and palm rest area for detection of downward force applied across the haptic combination touchpad and palm rest area.

14. The system of claim 12, wherein the force-sensing material is a thin film incorporating a force-sensing resistor.

15. A keyboard, and combination touchpad and palm rest haptic response system of an information handling system, comprising:
a coversheet to identify a key location of a haptic keyboard, and a combination haptic touchpad interface and palm rest area on a C-cover for the information handling system;
a haptic combination touchpad and palm rest piezoelectric element based feedback assembly disposed beneath the haptic combination touchpad interface and palm rest area and secured to the C-cover, further comprising:
a touchpad and palm rest contact foil placed between the coversheet and a touchpad and palm rest support layer;
the touchpad and palm rest piezoelectric element placed between the touchpad and palm rest contact foil and the touchpad and palm rest support layer to receive an applied mechanical stress at the location within the haptic combination touchpad and palm rest area and configured to generate a touchpad and palm rest piezo actuation signal, where the touchpad and palm rest piezo electric element is also configured to generate to generate a touchpad haptic feedback and a palm rest haptic feedback;
a haptic keyboard piezoelectric element based feedback assembly disposed beneath the haptic keyboard and secured to the C-cover;
a keyboard controller to receive a keyboard piezo actuation signal from a keyboard piezoelectric element and send a keyboard haptic feedback control signal to the keyboard piezoelectric element to cause the keyboard piezoelectric element to generate a keyboard haptic feedback at the key location; and
a palm rest and touchpad controller to receive the touchpad and palm rest piezo actuation signal from the touchpad and palm rest piezoelectric element and either send a touchpad haptic feedback control signal to the touchpad and palm rest piezoelectric element to cause the touchpad and palm rest piezoelectric element to generate a touchpad haptic feedback at an actuation location or to send a palm rest haptic feedback control signal to the touchpad and palm rest piezoelectric element to cause the touchpad and palm rest piezoelectric element to generate the palm rest haptic feedback at the actuation location depending on force level applied.

16. The system of claim 15, wherein the haptic keyboard piezoelectric element based feedback assembly further comprises:
a keyboard contact foil placed between the coversheet and a keyboard support layer; and
a keyboard piezoelectric element placed between the keyboard contact foil and the keyboard support layer to receive an applied mechanical stress at the key location and generate the keyboard piezo actuation signal.

17. The system of claim 15, wherein the haptic combination touchpad and palm rest piezoelectric element based feedback assembly further comprises:
a capacitive touch layer situated beneath the haptic combination touchpad and palm rest area and operatively coupled to a bottom surface of the coversheet to receive x- and y-coordinate location data.

18. The system of claim 15, wherein if the force applied does not meet a threshold level at an actuation location in a designated touchpad portion of the haptic combination touchpad interface and palm rest area, the touchpad and palm rest piezoelectric element provides no haptic tactile feedback.

19. The system of claim 15, wherein the haptic combination touchpad and palm rest piezoelectric element based feedback assembly further comprises:
a force-sensing material disposed atop the haptic combination touchpad and palm rest area for detection of downward force applied across the haptic combination touchpad and palm rest area.

20. The system of claim 19, wherein the force-sensing material is a thin film incorporating a force-sensing resistor.

* * * * *